(12) United States Patent
Zhu et al.

(10) Patent No.: US 12,316,829 B2
(45) Date of Patent: May 27, 2025

(54) DICTIONARY BASED CODING OF VIDEO DATA

(71) Applicant: Bytedance Inc., Los Angeles, CA (US)

(72) Inventors: Weijia Zhu, San Diego, CA (US); Jizheng Xu, San Diego, CA (US); Li Zhang, San Diego, CA (US); Hsiao Chiang Chuang, San Diego, CA (US); Kui Fan, San Diego, CA (US)

(73) Assignee: BYTEDANCE INC., Los Angeles, CA (US)

( * ) Notice: Subject to any disclaimer, the term of this patent is extended or adjusted under 35 U.S.C. 154(b) by 99 days.

(21) Appl. No.: 17/825,998

(22) Filed: May 26, 2022

(65) Prior Publication Data

US 2022/0286672 A1    Sep. 8, 2022

Related U.S. Application Data

(63) Continuation of application No. PCT/US2020/062546, filed on Nov. 30, 2020.

(30) Foreign Application Priority Data

Nov. 30, 2019    (WO) ................ PCT/CN2019/122267

(51) Int. Cl.
*H04N 19/105*    (2014.01)
*H04N 19/147*    (2014.01)
*H04N 19/176*    (2014.01)

(52) U.S. Cl.
CPC ......... *H04N 19/105* (2014.11); *H04N 19/147* (2014.11); *H04N 19/176* (2014.11)

(58) Field of Classification Search
None
See application file for complete search history.

(56) References Cited

U.S. PATENT DOCUMENTS

| | | | |
|---|---|---|---|
| 8,204,109 B2 | 6/2012 | Xiong et al. | |
| 9,271,006 B2 | 2/2016 | Huang et al. | |
| 9,986,255 B2 | 5/2018 | Wang et al. | |
| 10,542,274 B2 | 1/2020 | Li et al. | |
| 2011/0176607 A1 | 7/2011 | Kim et al. | |
| 2012/0163451 A1 | 6/2012 | Cohen et al. | |
| 2015/0326247 A1 | 11/2015 | Li | |
| 2015/0373359 A1* | 12/2015 | He | H04N 19/147 |
| | | | 375/240.12 |

(Continued)

FOREIGN PATENT DOCUMENTS

CN    107409215 A    11/2017

OTHER PUBLICATIONS

Bross et al. "Versatile Video Coding (Draft 7)," Joint Video Experts Team (JVET) of ITU-T SG 16 WP 3 and ISO/IEC ITC 1/SC 29/WG 11 16th Meeting: Geneva, CH, Oct. 1-11, 2019, document JVET-P2001, 2019.

(Continued)

*Primary Examiner* — Samuel D Fereja
(74) *Attorney, Agent, or Firm* — Conley Rose, P.C.

(57) ABSTRACT

A method of video processing is described. The method includes performing a conversion between a current block of a video and a bitstream representation of the video, wherein the current block is coded with a dictionary-based coding mode using one or more dictionaries, and wherein the conversion is based on the one or more dictionaries.

20 Claims, 19 Drawing Sheets

(56) References Cited

U.S. PATENT DOCUMENTS

| | | | |
|---|---|---|---|
| 2016/0006454 A1* | 1/2016 | Kataoka | H03M 7/30 |
| | | | 341/87 |
| 2016/0212448 A1 | 7/2016 | Wang et al. | |
| 2016/0227239 A1 | 8/2016 | Pu et al. | |
| 2016/0366443 A1 | 12/2016 | Holcomb et al. | |
| 2017/0064330 A1* | 3/2017 | Li | H04N 19/90 |
| 2018/0048895 A1 | 2/2018 | Jeon et al. | |
| 2018/0288446 A1 | 10/2018 | An et al. | |
| 2018/0302633 A1 | 10/2018 | Sole et al. | |
| 2019/0208217 A1* | 7/2019 | Zhou | H04N 19/176 |
| 2019/0281311 A1 | 9/2019 | Ye et al. | |

OTHER PUBLICATIONS

Chao et al. "CE8-1.3: Line-based CG Palette Mode," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P0077, 2019.

Chen et al. "Non-CE8: On Palette Mode Signaling Binarization," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P0516, 2019.

"Information Technology—High Efficiency Coding and Media Delivery in Heterogeneous Environments—Part 2: High Efficiency Video Coding" Apr. 20, 2018, ISO/DIS 23008, 4th Edition.

Kang et al. "Efficient Dictionary Based Video Coding with Reduced Side Information," Mitsubishi Electric Research Laboratories, 2011 IEEE International Symposium of Circuits and Systems (ISCAS), May 18, 2011, retrieved on Mar. 16, 2021.

Xu et al. "CE8-Related: Combination Test of JVET-N0176/JVET-N0317/JVET-N0382 on Simplification of IBC Vector Prediction," Joint Video Experts Team (JVET) of ITU-T SG 16 WP 3 and ISO/IEC JTC 1/SC 29/WG 11 14th Meeting: Geneva, CH, Mar. 19-27, 2019, document JVET-N0843, 2019.

Zhu et al. "CE8-related: Palette Mode Coding," Joint Video Experts Team (JVET) of ITU-T SG 16 WP 3 and ISO/IEC ITC 1/SC 29/WG 11 14th Meeting: Geneva, CH, Mar. 19-27, 2019, document JVET-N0258, 2019.

http://phenix.it-sudparis.eu/jvet/doc_end_user/current_document.php?id=5755.

https://vcgit.hhi.fraunhofer.de/jvet/VVCSoftware_VTM/tags/VTM-4.0.

International Search Report and Written Opinion from International Patent Application No. PCT/US2020/062546 dated Apr. 12, 2021 (26 pages).

International Search Report and Written Opinion from International Patent Application No. PCT/US2020/062550 dated Feb. 11, 2021 (9 pages).

First Office Action for Chinese Application No. 202080082778.5, mailed on Jan. 13, 2025, 16 pages.

* cited by examiner

[1210] Performing a conversion between a current block of a video and a bitstream representation of the video, the conversion using a dictionary-based coding mode that maintains or updates one or more dictionaries during an encoding and/or decoding process for the current block, and the conversion being based on the one or more dictionaries

[1310] Performing a conversion between a current block of a video coded using a palette mode and a bitstream representation of the video, the conversion comprising saving and loading a palette predictor of a palette in the palette mode based on a usage of a local dual tree in the conversion

FIG. 13

DICTIONARY BASED CODING OF VIDEO DATA

CROSS REFERENCE TO RELATED APPLICATIONS

This application is a continuation of International Patent Application No. PCT/US2020/062546, filed on Nov. 30, 2020, which claims the priority to and benefits of International Patent Application No. PCT/CN2019/122267, filed on Nov. 30, 2019. All the aforementioned patent applications are hereby incorporated by reference in their entireties.

TECHNICAL FIELD

This document is related to video coding techniques, systems and devices.

BACKGROUND

Digital video accounts for the largest bandwidth use on the internet and other digital communication networks. As the number of connected user devices capable of receiving and displaying video increases, it is expected that the bandwidth demand for digital video usage will continue to grow.

SUMMARY

Devices, systems and methods related to digital video coding, which include dictionary-based coding modes for screen content coding, are described. The described methods may be applied to both the existing video coding standards (e.g., High Efficiency Video Coding (HEVC) and/or Versatile Video Coding (VVC)) and future video coding standards or video codecs.

In one representative aspect, the disclosed technology may be used to provide a method for video processing. This method includes performing a conversion between a current block of a video and a bitstream representation of the video, wherein the current block is coded with a dictionary-based coding mode using one or more dictionaries, and wherein the conversion is based on the one or more dictionaries.

In another representative aspect, the disclosed technology may be used to provide a method for video processing. This method includes determining, for a conversion between a video including video blocks and a bitstream representation of the video, to use one or more dictionaries for a video block based on one or more coding characteristic of the video block according to a rule; and performing the conversion based on the determining, wherein the coding characteristic includes a size of a video block and/or information in the bitstream representation.

In another representative aspect, the disclosed technology may be used to provide a method for video processing. This method includes determining, for a current block of a video to which a dictionary-based coding mode is applied, a prediction block of the current block based on one or more entries of a dictionary; and performing a conversion between the current block and a bitstream representation of the video based on the determining.

In another representative aspect, the disclosed technology may be used to provide a method for video processing. This method includes performing a conversion between a current video unit of a current video region of a video and a bitstream representation of the video, wherein the current video unit is coded in a dictionary-based coding mode using a dictionary, and wherein the dictionary is reset before coding the current video region and updated after coding the current video unit.

In another representative aspect, the disclosed technology may be used to provide a method for video processing. This method includes performing a conversion between a current block of a video and a bitstream representation of the video, wherein the current block is coded in a dictionary-based coding mode using a dictionary, wherein a prediction block or a reconstruction block of the current block is derived by sorting entries in the dictionary.

In another representative aspect, the disclosed technology may be used to provide a method for video processing. This method includes performing a conversion between a current block of a video and a bitstream representation of the video, wherein the current block is coded in a dictionary-based coding mode using a dictionary, and wherein indices of one or more entries of the dictionary are included in the bitstream representation.

In another representative aspect, the disclosed technology may be used to provide a method for video processing. This method includes performing a conversion between a current block of a video and a bitstream representation of the video, wherein the current block is coded using a palette mode, and wherein the bitstream representation includes syntax elements that are representative of escape samples for each of coefficient groups of the current block.

In yet another representative aspect, the above-described method is embodied in the form of processor-executable code and stored in a computer-readable program medium.

In yet another representative aspect, a device that is configured or operable to perform the above-described method is disclosed. The device may include a processor that is programmed to implement this method.

In yet another representative aspect, a video decoder apparatus may implement a method as described herein.

The above and other aspects and features of the disclosed technology are described in greater detail in the drawings, the description and the claims.

BRIEF DESCRIPTION OF THE DRAWINGS

FIG. 5 shows an example of horizontal and vertical traverse scans.

FIG. 12 is a flowchart for an example of a video processing method.

FIG. 13 is a flowchart for another example of a video processing method.

DETAILED DESCRIPTION

The present document provides various techniques that can be used by a decoder of image or video bitstreams to improve the quality of decompressed or decoded digital video or images. For brevity, the term "video" is used herein to include both a sequence of pictures (traditionally called video) and individual images. Furthermore, a video encoder may also implement these techniques during the process of encoding in order to reconstruct decoded frames used for further encoding.

Section headings are used in the present document for ease of understanding and do not limit the embodiments and techniques to the corresponding sections. As such, embodiments from one section can be combined with embodiments from other sections.

1. Summary

This document is related to video coding technologies. Specifically, it is related to dictionary-based coding modes for screen content coding. It may be applied to the existing video coding standard like HEVC, or the standard (Versatile Video Coding) to be finalized. It may be also applicable to future video coding standards or video codec.

2. Example Embodiments for Video Coding

Video coding standards have evolved primarily through the development of the well-known ITU-T and ISO/IEC standards. The ITU-T produced H.261 and H.263, ISO/IEC produced MPEG-1 and MPEG-4 Visual, and the two organizations jointly produced the H.262/MPEG-2 Video and H.264/MPEG-4 Advanced Video Coding (AVC) and H.265/HEVC standards. Since H.262, the video coding standards are based on the hybrid video coding structure wherein temporal prediction plus transform coding are utilized. To explore the future video coding technologies beyond HEVC, Joint Video Exploration Team (JVET) was founded by VCEG and MPEG jointly in 2015. Since then, many new methods have been adopted by JVET and put into the reference software named Joint Exploration Model (JEM). In April 2018, the Joint Video Expert Team (JVET) between VCEG (Q6/16) and ISO/IEC JTC1 SC29/WG11 (MPEG) was created to work on the VVC standard targeting at 50% bitrate reduction compared to HEVC.

2.1 Intra Block Copy

Figure 1:
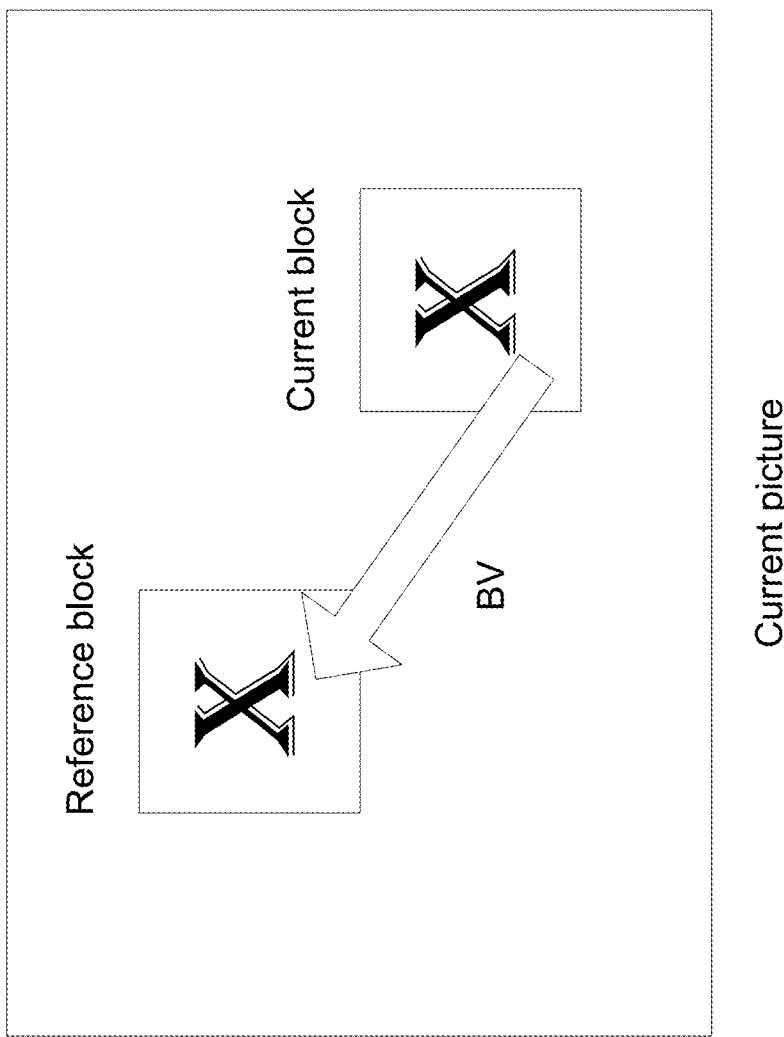
FIG. 1 shows an example of intra block copy.

Intra block copy (IBC), a.k.a. current picture referencing, has been adopted in HEVC Screen Content Coding extensions (HEVC-SCC) and the current VVC test model (VTM-4.0). IBC extends the concept of motion compensation from inter-frame coding to intra-frame coding. As demonstrated in FIG. 1, the current block is predicted by a reference block in the same picture when IBC is applied. The samples in the reference block must have been already reconstructed before the current block is coded or decoded. Although IBC is not so efficient for most camera-captured sequences, it shows significant coding gains for screen content. The reason is that there are lots of repeating patterns, such as icons and text characters in a screen content picture. IBC can remove the redundancy between these repeating patterns effectively. In HEVC-SCC, an inter-coded coding unit (CU) can apply IBC if it chooses the current picture as its reference picture. The MV is renamed as block vector (BV) in this case, and a BV always has an integer-pixel precision. To be compatible with main profile HEVC, the current picture is marked as a "long-term" reference picture in the Decoded Picture Buffer (DPB). It should be noted that similarly, in multiple view/3D video coding standards, the inter-view reference picture is also marked as a "long-term" reference picture.

Following a BV to find its reference block, the prediction can be generated by copying the reference block. The residual can be got by subtracting the reference pixels from the original signals. Then transform and quantization can be applied as in other coding modes.

However, when a reference block is outside of the picture, or overlaps with the current block, or outside of the reconstructed area, or outside of the valid area restricted by some constrains, part or all pixel values are not defined. Basically, there are two solutions to handle such a problem. One is to disallow such a situation, e.g. in bitstream conformance. The other is to apply padding for those undefined pixel values. The following sub-sessions describe the solutions in detail.

2.1.1 IBC in HEVC Screen Content Coding Extensions

In the screen content coding extensions of HEVC, when a block uses current picture as reference, it should guarantee that the whole reference block is within the available reconstructed area, as indicated in the following spec text:

The variables offsetX and offsetY are derived as follows:

$$\text{offsetX}=(\text{ChromaArrayType}==0)?0: (\text{mvCLX}[0]\&\ 0\text{x}7?2:0) \quad (8\text{-}106)$$

$$\text{offsetY}=(\text{ChromaArrayType}==0)?0: (\text{mvCLX}[1]\&\ 0\text{x}7?2:0) \quad (8\text{-}107)$$

It is a requirement of bitstream conformance that when the reference picture is the current picture, the luma motion vector mvLX shall obey the following constraints:

1. When the derivation process for z-scan order block availability as specified in clause 6.4.1 is invoked with (xCurr, yCurr) set equal to (xCb, yCb) and the neighbouring luma location (xNbY, yNbY) set equal to (xPb+(mvLX[0]>>2)−offsetX, yPb+(mvLX[1]>>2)−offsetY) as inputs, the output shall be equal to TRUE.
2. When the derivation process for z-scan order block availability as specified in clause 6.4.1 is invoked with (xCurr, yCurr) set equal to (xCb, yCb) and the neighbouring luma location (xNbY, yNbY) set equal to (xPb+(mvLX[0]>>2)+nPbW−1+offsetX, yPb+(mvLX[1]>>2)+nPbH−1+offsetY) as inputs, the output shall be equal to TRUE.
3. One or both the following conditions shall be true:
    The value of (mvLX[0]>>2)+nPbW+xB1+offsetX is less than or equal to 0.
    The value of (mvLX[1]>>2)+nPbH+yB1+offsetY is less than or equal to 0.
4. The following condition shall be true:

$$(\text{xPb}+(\text{mvLX}[0]\!>\!>\!2)+\text{nPbSw}-1+\text{offsetX})/\text{CtbSizeY}-\\ \text{xCurr}/\text{CtbSizeY}\ \text{yCurr}/\text{CtbSizeY}-(\text{yPb}+(\text{mvLX}\\ [1]\!>\!>\!2)+\text{nPbSh}-1+\text{offsetY})/\text{CtbSizeY} \quad (8\text{-}108)$$

Thus, the case that the reference block overlaps with the current block or the reference block is outside of the picture will not happen. There is no need to pad the reference or prediction block.

2.1.2 IBC in VVC Test Model

In the current VVC test model, i.e. VTM-4.0 design, the whole reference block should be with the current coding tree unit (CTU) and does not overlap with the current block. Thus, there is no need to pad the reference or prediction block. The IBC flag is coded as a prediction mode of the current CU. Thus, there are totally three prediction modes, MODE_INTRA, MODE_INTER and MODE_IBC for each CU.

2.1.2.1 IBC Merge Mode

In IBC merge mode, an index pointing to an entry in the IBC merge candidates list is parsed from the bitstream. The construction of the IBC merge list can be summarized according to the following sequence of steps:

Step 1: Derivation of spatial candidates
Step 2: Insertion of HMVP candidates
Step 3: Insertion of pairwise average candidates In the derivation of spatial merge candidates, a maximum of four merge candidates are selected among candidates located in the positions depicted in the figures. The order of derivation is A1, B1, B0, A0 and B2. Position B2 is considered only when any PU of position A1, B1, B0, A0 is not available (e.g. because it belongs to another slice or tile) or is not coded with IBC mode. After candidate at position A1 is added, the insertion of the remaining candidates is subject to a redundancy check which ensures that candidates with same motion information are excluded from the list so that coding efficiency is improved.

After insertion of the spatial candidates, if the IBC merge list size is still smaller than the maximum IBC merge list size, IBC candidates from HMVP table may be inserted. Redundancy check are performed when inserting the HMVP candidates.

Finally, pairwise average candidates are inserted into the IBC merge list.

When a reference block identified by a merge candidate is outside of the picture, or overlaps with the current block, or outside of the reconstructed area, or outside of the valid area restricted by some constrains, the merge candidate is called invalid merge candidate.

It is noted that invalid merge candidates may be inserted into the IBC merge list.

Figure 2:
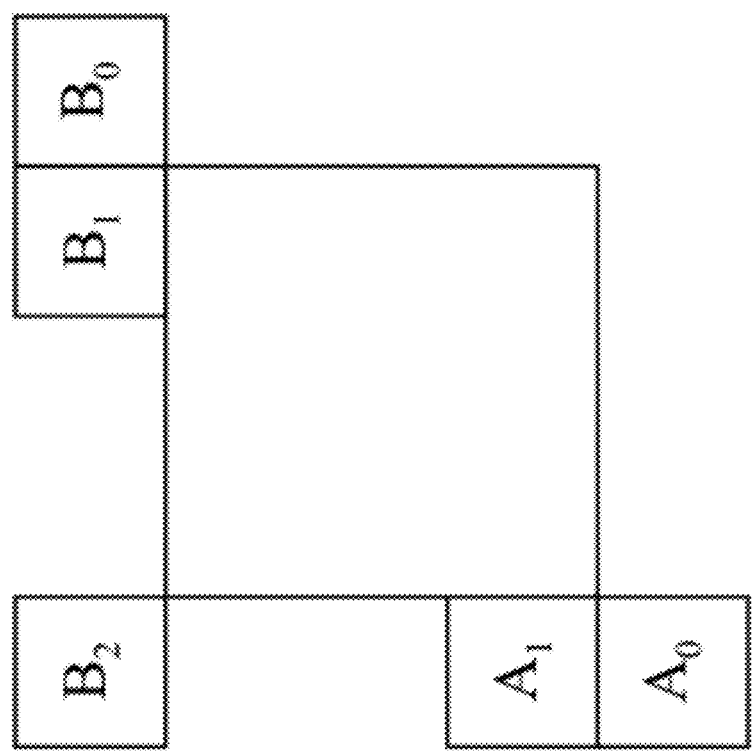
FIG. 2 shows an example of five spatial neighboring candidates.

JVET-N0843 is adopted to the VVC. In the JVET-N0843. the BV predictors for merge mode and AMVP mode in IBC will share a common predictor list, which consist of the following elements:

2 spatial neighboring positions (A1, B1 as in FIG. 2)
5 HMVP entries
Zero vectors by default For merge mode, up to first 6 entries of this list will be used; for AMVP mode, the first 2 entries of this list will be used. And the list conforms with the shared merge list region requirement (shared the same list within the SMR).

In addition to the above-mentioned BV predictor candidate list, JVET-N0843 also proposed to simplify the pruning operations between HMVP candidates and the existing merge candidates (A1, B1). In the simplification there will be up to 2 pruning operations since it only compares the first HMVP candidate with spatial merge candidate(s).

In the latest VVC and VTM5, it is proposed to explicitly use syntax constraint for disabling 128×128 IBC mode on top of the current bitstream constraint in the previous VTM and VVC versions, which makes presence of IBC flag dependent on CU size<128×128.

2.1.2.2 IBC AMVP Mode

In IBC AMVP mode, an AMVP index point to an entry in the IBC AMVP list is parsed from the bitstream. The construction of the IBC AMVP list can be summarized according to the following sequence of steps:

Step 1: Derivation of spatial candidates
  Check A0, A1 until an available candidate is found.
  Check B0, B1, B2 until an available candidate is found.
Step 2: Insertion of HMVP candidates
Step 3: Insertion of zero candidates After insertion of the spatial candidates, if the IBC AMVP list size is still smaller than the maximum IBC AMVP list size, IBC candidates from HMVP table may be inserted.

Finally, zero candidates are inserted into the IBC AMVP list.

2.1.2.3 IBC Virtual Buffer

A virtual buffer concept is introduced to help describing the reference region for IBC prediction mode an adopted into VVC draft. For CTU size being ctbSize, we denote wIbcBuf=128*128/ctbSize and define a virtual IBC buffer, ibcBuf, with width being wIbcBuf and height being ctbSize. Thus, For CTU size being 128×128, the size of ibcBuf is also 128×128.
For CTU size being 64×64, the size of ibcBuf is 256×64.
For CTU size being 32×32, the size of ibcBuf is 512×32.

It is noted that VPDU width and height are min(ctbSize, 64). We denote Wv=min(ctbSize, 64).

The virtual IBC buffer, ibcBuf is maintained as follows.

(1) At the beginning of decoding each CTU row, refresh the whole ibcBuf with value (−1).
(2) At the beginning of decoding a VPDU (xVPDU, yVPDU) relative to the top-left corner of the picture, set the ibcBuf[x][y]=−1, with x=xVPDU % wIbcBuf, xVPDU % wIbcBuf+Wv−1; y=yVPDU % ctbSize, . . . , yVPDU % ctbSize+Wv−1.
(3) After decoding a CU contains (x, y) relative to the top-left of the picture, set
ibcBuf[x % wIbcBuf][y % ctbSize]=recSample[x][y]

So a bitstream constrain can be simply described as

It is a requirement of bitstream comformance that for a bv, ibcBuf[(x+bv[0])% wIbcBuf][(y+bv[1]) % ctbSize] shall not be equal to −1.

With the concept of IBC reference buffer, it also simplifies the text for the decoding process by avoid reference to the inter interpolation and motion compensation process, including subblock process.

In addition, the texts of General decoding process for coding units coded in IBC prediction mode in JVET-P2001 is shown as below.

Inputs to this process are:

5. a luma location (xCb, yCb) specifying the top-left sample of the current coding block relative to the top left luma sample of the current picture,
6. a variable cbWidth specifying the width of the current coding block in luma samples,
7. a variable cbHeight specifying the height of the current coding block in luma samples,
8. a variable treeType specifying whether a single or a dual tree is used and if a dual tree is used, it specifies whether the current tree corresponds to the luma or chroma components.

Output of this process is a modified reconstructed picture before in-loop filtering.

The derivation process for quantization parameters as specified in clause 8.7.1 is invoked with the luma location (xCb, yCb), the width of the current coding block in luma samples cbWidth and the height of the current coding block in luma samples cbHeight, and the variable treeType as inputs.

The variable IsGt4by4 is derived as follows:

IsGt4by4=(cbWidth*cbHeight>16)?TRUE:FALSE    (8-893)

The decoding process for coding units coded in IBC prediction mode consists of the following ordered steps:
1. The block vector components of the current coding unit are derived as follows:
   9. The derivation process for block vector components as specified in clause 8.6.2.1 is invoked with the luma coding block location (xCb, yCb), the luma coding block width cbWidth and the luma coding block height cbHeight as inputs, and the luma block vector bvL as output.
   10. When treeType is equal to SINGLE_TREE, the derivation process for chroma block vectors in clause 8.6.2.5 is invoked with luma block vector bvL as input, and chroma block vector bvC as output.
2. The prediction samples of the current coding unit are derived as follows:
   11. The decoding process for IBC blocks as specified in clause 8.6.3.1 is invoked with the luma coding block location (xCb, yCb), the luma coding block width cbWidth and the luma coding block height cbHeight, the luma block vector bvL, the variable cIdx set equal to 0 as inputs, and the IBC prediction samples (predSamples) that are an (cbWidth)×(cbHeight) array predSamplesL of prediction luma samples as outputs.
   12. When treeType is equal to SINGLE_TREE, the prediction samples of the current coding unit are derived as follows:
      i. The decoding process for IBC blocks as specified in clause 8.6.3.1 is invoked with the luma coding block location (xCb, yCb), the luma coding block width cbWidth and the luma coding block height cbHeight, the chroma block vector bvC and the variable cIdx set equal to 1 as inputs, and the IBC prediction samples (predSamples) that are an (cbWidth/SubWidthC)×(cbHeight/SubHeightC) array predSamplesCb of prediction chroma samples for the chroma components Cb as outputs.
      ii. The decoding process for IBC blocks as specified in clause 8.6.3.1 is invoked with the luma coding block location (xCb, yCb), the luma coding block width cbWidth and the luma coding block height cbHeight, the chroma block vector bvC and the variable cIdx set equal to 2 as inputs, and the IBC prediction samples (predSamples) that are an (cbWidth/SubWidthC)×(cbHeight/SubHeightC) array predSamplesCr of prediction chroma samples for the chroma components Cr as outputs.
3. The residual samples of the current coding unit are derived as follows:
   13. The decoding process for the residual signal of coding blocks coded in inter prediction mode as specified in clause 8.5.8 is invoked with the location (xTb0, yTb0) set equal to the luma location (xCb, yCb), the width nTbW set equal to the luma coding block width cbWidth, the height nTbH set equal to the luma coding block height cbHeight and the variable cIdx set equal to 0 as inputs, and the array resSamplesL as output.
   14. When treeType is equal to SINGLE_TREE, the decoding process for the residual signal of coding blocks coded in inter prediction mode as specified in clause 8.5.8 is invoked with the location (xTb0, yTb0) set equal to the chroma location (xCb/SubWidthC, yCb/SubHeightC), the width nTbW set equal to the chroma coding block width cbWidth/SubWidthC, the height nTbH set equal to the chroma coding block height cbHeight/SubHeightC and the variable cIdx set equal to 1 as inputs, and the array resSamplesCb as output.
   15. When treeType is equal to SINGLE_TREE, the decoding process for the residual signal of coding blocks coded in inter prediction mode as specified in clause 8.5.8 is invoked with the location (xTb0, yTb0) set equal to the chroma location (xCb/SubWidthC, yCb/SubHeightC), the width nTbW set equal to the chroma coding block width cbWidth/SubWidthC, the height nTbH set equal to the chroma coding block height cbHeight/SubHeightC and the variable cIdxset equal to 2 as inputs, and the array resSamplesCr as output.
4. The reconstructed samples of the current coding unit are derived as follows:
   16. The picture reconstruction process for a colour component as specified in clause 8.7.5 is invoked with the block location (xB, yB) set equal to (xCb, yCb), the block width bWidth set equal to cbWidth, the block height bHeight set equal to cbHeight, the variable treeType, the variable cIdx set equal to 0, the (cbWidth)×(cbHeight) array predSamples set equal to predSamplesL and the (cbWidth)×(cbHeight) array resSamples set equal to resSamplesL as inputs, and the output is a modified reconstructed picture before in-loop filtering.
   17. When treeType is equal to SINGLE_TREE, the picture reconstruction process for a colour component as specified in clause 8.7.5 is invoked with the block location (xB, yB) set equal to (xCb/SubWidthC, yCb/SubHeightC), the block width bWidth set equal to cbWidth/SubWidthC, the block height bHeight set equal to cbHeight/SubHeightC, the variable treeType, the variable cIdx set equal to 1, the (cbWidth/SubWidthC)×(cbHeight/SubHeightC) array predSamples set equal to predSamplesCb and the (cbWidth/SubWidthC)×(cbHeight/SubHeightC) array resSamples set equal to resSamplesCb as inputs, and the output is a modified reconstructed picture before in-loop filtering.
   18. When treeType is equal to SINGLE_TREE, the picture reconstruction process for a colour component as specified in clause 8.7.5 is invoked with the block location (xB, yB) set equal to (xCb/SubWidthC, yCb/SubHeightC), the block width bWidth set equal to cbWidth/SubWidthC, the block height bHeight set equal to cbHeight/SubHeightC, the variable treeType, the variable cIdx set equal to 2, the (cbWidth/SubWidthC)×(cbHeight/SubHeightC) array predSamples set equal to predSamplesCr and the (cbWidth/SubWidthC)×(cbHeight/SubHeightC) array resSamples set equal to resSamplesCr as inputs, and the output is a modified reconstructed picture before in-loop filtering.

2.2 Palette Mode in HEVC Screen Content Coding Extensions (HEVC-SCC)

2.2.1 Concept of Palette Mode

Figure 3:
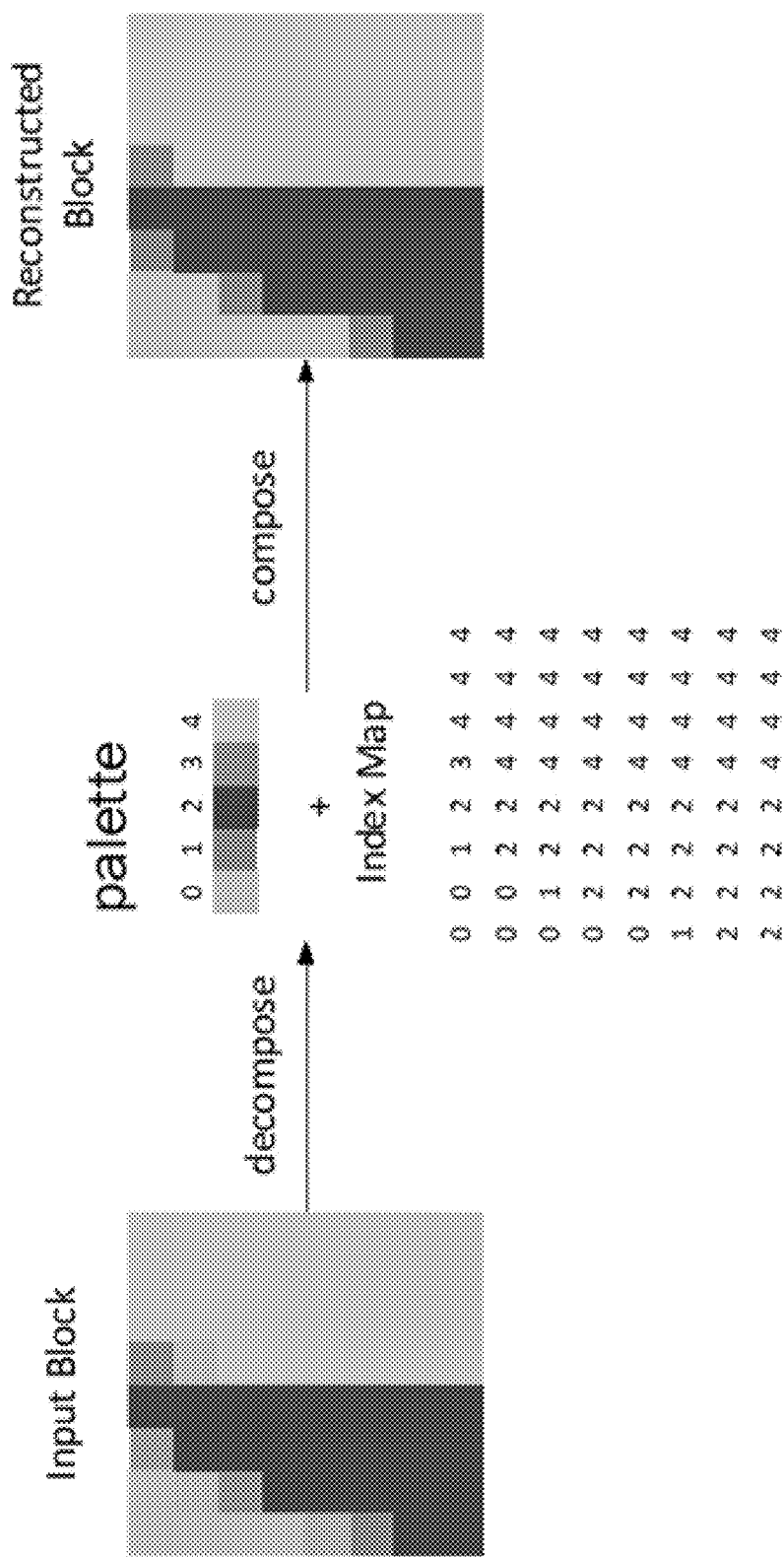
FIG. 3 shows an example of a block coded in palette mode.

The basic idea behind a palette mode is that the pixels in the CU are represented by a small set of representative color values. This set is referred to as the palette. And it is also possible to indicate a sample that is outside the palette by signaling an escape symbol followed by (possibly quantized) component values. This kind of pixel is called escape pixel. The palette mode is illustrated in FIG. 3. As depicted in FIG. 3, for each pixel with three color components (luma, and two chroma components), an index to the palette is founded, and the block could be reconstructed based on the founded values in the palette.

2.2.2 Palette Mode in HEVC-SSC

For coding of the palette entries, a palette predictor is maintained. The maximum size of the palette as well as the palette predictor is signaled in the SPS. In HEVC-SCC, a palette_predictor_initializer_present_flag is introduced in the PPS. When this flag is 1, entries for initializing the palette predictor are signaled in the bitstream. The palette predictor is initialized at the beginning of each CTU row, each slice and each tile. Depending on the value of the palette_predictor_initializer_present_flag, the palette predictor is reset to 0 or initialized using the palette predictor intializer entries signaled in the PPS. In HEVC-SCC, a palette predictor initializer of size 0 was enabled to allow explicit disabling of the palette predictor initialization at the PPS level.

Figure 4:
FIG. 4 shows an example of use of a palette predictor to signal palette entries.

For each entry in the palette predictor, a reuse flag is signaled to indicate whether it is part of the current palette. This is illustrated in FIG. 4. The reuse flags are sent using run-length coding of zeros. After this, the number of new palette entries are signaled using exponential Golomb code of order 0. Finally, the component values for the new palette entries are signaled.

Figure 5:
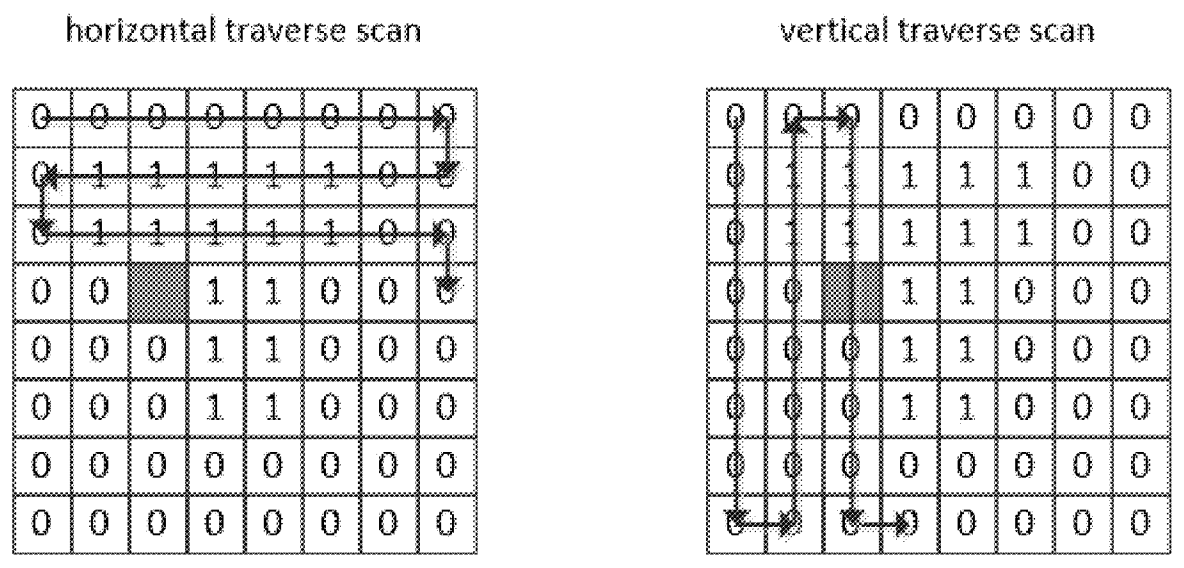

The palette indices are coded using horizontal and vertical traverse scans as shown in FIG. 5. The scan order is explicitly signaled in the bitstream using the palette_transpose_flag. For the rest of the subsection it is assumed that the scan is horizontal.

Figure 6:
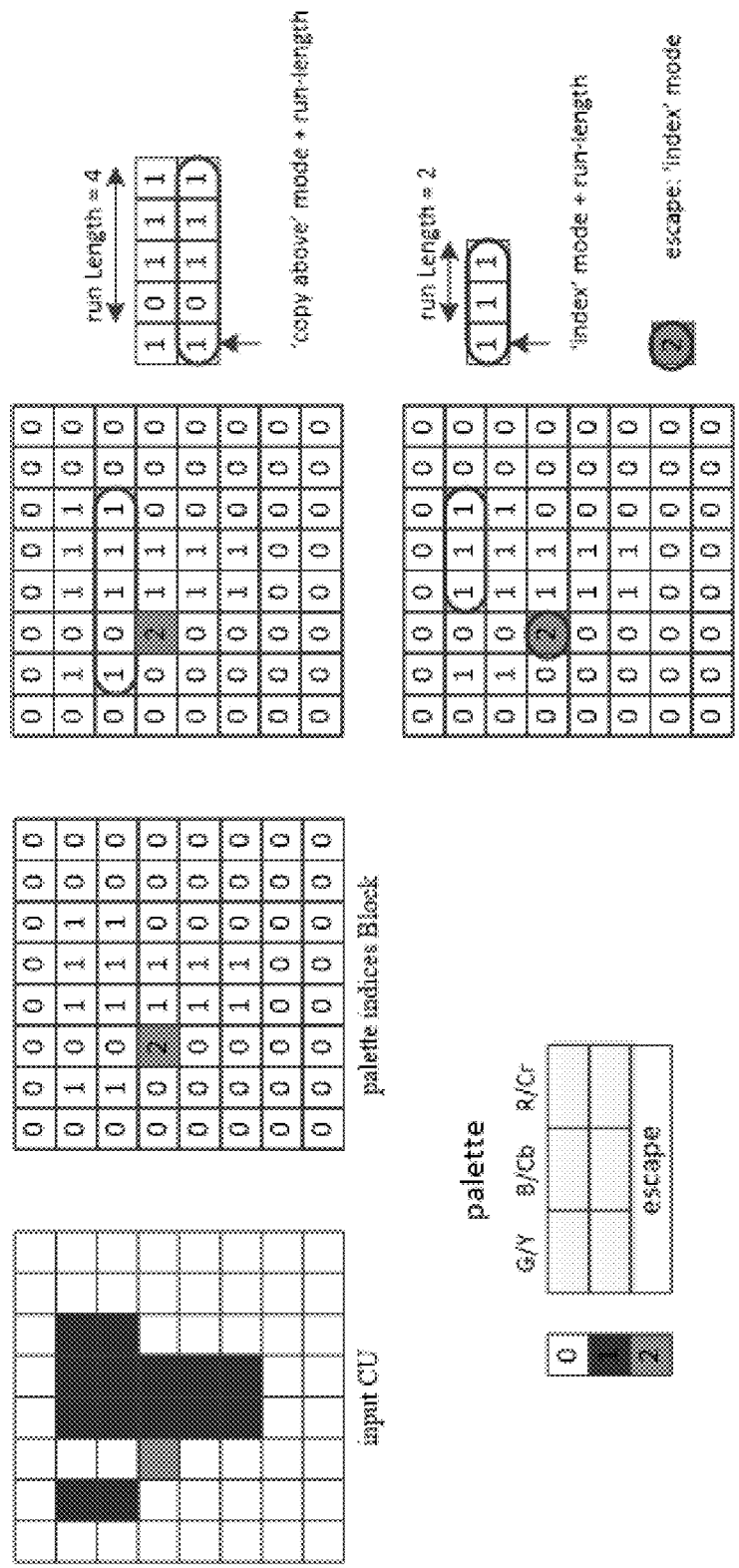
FIG. 6 shows an example of coding of palette indices.

The palette indices are coded using two main palette sample modes: 'INDEX' and 'COPY_ABOVE'. As explained previously, the escape symbol is also signaled as an 'INDEX' mode and assigned an index equal to the maximum palette size. The mode is signaled using a flag except for the top row or when the previous mode was 'COPY_ABOVE'. In the 'COPY_ABOVE' mode, the palette index of the sample in the row above is copied. In the 'INDEX' mode, the palette index is explicitly signaled. For both 'INDEX' and 'COPY_ABOVE' modes, a run value is signaled which specifies the number of subsequent samples that are also coded using the same mode. When escape symbol is part of the run in 'INDEX' or 'COPY_ABOVE' mode, the escape component values are signaled for each escape symbol. The coding of palette indices is illustrated in FIG. 6.

This syntax order is accomplished as follows. First the number of index values for the CU is signaled. This is followed by signaling of the actual index values for the entire CU using truncated binary coding. Both the number of indices as well as the index values are coded in bypass mode. This groups the index-related bypass bins together. Then the palette sample mode (if necessary) and run are signaled in an interleaved manner. Finally, the component escape values corresponding to the escape samples for the entire CU are grouped together and coded in bypass mode.

An additional syntax element, last_run_type_flag, is signaled after signaling the index values. This syntax element, in conjunction with the number of indices, eliminates the need to signal the run value corresponding to the last run in the block.

In HEVC-SCC, the palette mode is also enabled for 4:2:2, 4:2:0, and monochrome chroma formats. The signaling of the palette entries and palette indices is almost identical for all the chroma formats. In case of non-monochrome formats, each palette entry consists of 3 components. For the monochrome format, each palette entry consists of a single component. For sub sampled chroma directions, the chroma samples are associated with luma sample indices that are divisible by 2. After reconstructing the palette indices for the CU, if a sample has only a single component associated with it, only the first component of the palette entry is used. The only difference in signaling is for the escape component values. For each escape sample, the number of escape component values signaled may be different depending on the number of components associated with that sample.

In addition, there is an index adjustment process in the palette index coding. When signaling a palette index, the left neighboring index or the above neighboring index should be different from the current index. Therefore, the range of the current palette index could be reduced by 1 by removing one possibility. After that, the index is signaled with truncated binary (TB) binarization.

The texts related to this part is shown as follows, where the CurrPaletteIndex is the current palette index and the adjustedRefPaletteIndex is the prediction index.

The variable PaletteIndexMap[xC][yC] specifies a palette index, which is an index to the array represented by CurrentPaletteEntries. The array indices xC, yC specify the location (xC, yC) of the sample relative to the top-left luma sample of the picture. The value of PaletteIndexMap[xC][yC] shall be in the range of 0 to MaxPaletteIndex, inclusive.

The variable adjustedRefPaletteIndex is derived as follows:

```
adjustedRefPaletteIndex = MaxPaletteIndex + 1
if( PaletteScanPos > 0 ) {
  xcPrev =
  x0 + TraverseScanOrder[ log2CbWidth ][ log2bHeight ][ PaletteScanPos − 1 ][ 0 ]
  ycPrev =
  y0 + TraverseScanOrder[ log2CbWidth ][ log2bHeight ][ PaletteScanPos − 1 ][ 1 ]
    if( CopyAboveIndicesFlag[ xcPrev ][ ycPrev ] == 0 ) {
      adjustedRefPaletteIndex = PaletteIndexMap[ xcPrev ][ ycPrev ]{(7-157)
    }
}
```

-continued

```
  else {
    if( !palette_transpose_flag )
      adjustedRefPaletteIndex = PaletteIndexMap[ xC ][ yC − 1 ]
    else
      adjustedRefPaletteIndex = PaletteIndexMap[ xC − 1 ][ yC ]
  }
}
```

When CopyAboveIndicesFlag[xC][yC] is equal to 0, the variable CurrPaletteIndex is derived as follows:
   if (CurrPaletteIndex>=adjustedRefPaletteIndex)
      CurrPaletteIndex++

2.2.3 Palette Mode in VVC
2.2.3.1 Palette in Dual Tree

In VVC, the dual tree coding structure is used on coding the intra slices, so the luma component and two chroma components may have different palette and palette indices. In addition, the two chroma component shares same palette and palette indices.

2.2.3.2 Palette as a Separate Mode

In JVET-N0258 and current VTM, the prediction modes for a coding unit can be MODE_INTRA, MODE_INTER, MODE_IBC and MODE_PLT. The binarization of prediction modes is changed accordingly.

When IBC is turned off, on I tiles, the first one bin is employed to indicate whether the current prediction mode is MODE_PLT or not. While on P/B tiles, the first bin is employed to indicate whether the current prediction mode is MODE_INTRA or not. If not, one additional bin is employed to indicate the current prediction mode is MODE_PLT or MODE_INTER.

When IBC is turned on, on I tiles, the first bin is employed to indicate whether the current prediction mode is MODE_IBC or not. If not, the second bin is employed to indicate whether the current prediction mode is MODE_PLT or MODE_INTRA. While on P/B tiles, the first bin is employed to indicate whether the current prediction mode is MODE_INTRA or not. If it's an intra mode, the second bin is employed to indicate the current prediction mode is MODE_PLT or MODE_INTRA. If not, the second bin is employed to indicate the current prediction mode is MODE_IBC or MODE_INTER.

Furthermore, JVET-P0516 was adopted. It is proposed to signal MODE_PLT when the prediction mode is MODE_INTRA under all conditions. The proposed modification only introduce change under the condition when only inter, intra and PLT modes are allowed.

2.2.3.3 Line Based CG Palette Mode

Line based CG palette mode was adopted to VVC. In this method, each CU of palette mode is divided into multiple segments of m samples (m=16 in this test) based on the traverse scan mode. The encoding order for palette run coding in each segment is as follows: For each pixel, 1 context coded bin run_copy_flag=0 is signalled indicating if the pixel is of the same mode as the previous pixel, i.e., if the previous scanned pixel and the current pixel are both of run type COPY_ABOVE or if the previous scanned pixel and the current pixel are both of run type INDEX and the same index value. Otherwise, run_copy_flag=1 is signaled. If the pixel and the previous pixel are of different mode, one context coded bin copy above palette indices flag is signaled indicating the run type, i.e., INDEX or COPY_ABOVE, of the pixel. Same as the palette mode in VTM6.0, decoder doesn't have to parse run type if the sample is in the first row (horizontal traverse scan) or in the first column (vertical traverse scan) since the INDEX mode is used by default. Also, decoder doesn't have to parse run type if the previously parsed run type is COPY_ABOVE. After palette run coding of pixels in one segment, the index values (for INDEX mode) and quantized escape colors are bypass coded and grouped apart from encoding/parsing of context coded bins to improve throughput within each line CG. Since the index value is now coded/parsed after run coding, instead of processed before palette run coding as in VTM, encoder doesn't have to signal the number of index values num_palette_indices_minus1 and the last run type copy_above_indices_for_final_run_flag.

The texts of line-based CG mode for palette mode provided by JVET-P0077 is shown as follows.

|  | Descriptor |
|---|---|
| palette_coding( x0, y0, cbWidth, cbHeight, startComp, numComps ) { | |
|   palettePredictionFinished = 0 | |
|   NumPredictedPaletteEntries = 0 | |
|   for( predictorEntryIdx = 0; predictorEntryIdx <PredictorPaletteSize[ startComp ] && | |
|       !palettePredictionFinished && | |
|       NumPredictedPaletteEntries[ startComp ] < palette_max_size; predictorEntryIdx++ ) { | |
|     palette_predictor_run | ae(v) |
|     if( palette_predictor_run != 1 ) { | |
|       if( palette_predictor_run > 1 ) | |
|         predictorEntryIdx += palette_predictor_run − 1 | |
|       PalettePredictorEntryReuseFlags[ predictorEntryIdx ] = 1 | |
|       NumPredictedPaletteEntries++ | |
|     } else | |
|       palettePredictionFinished = 1 | |
|   } | |

| | Descriptor |
|---|---|
| if( NumPredictedPaletteEntries < palette_max_size ) | |
|     num_signalled_palette_entries | ae(v) |
| for( cIdx = startComp; cIdx < ( startComp + numComps); cIdx++ ) | |
|     for( i = 0; i < num_signalled_palette_entries; i++ ) | |
|         new_palette_entries[ cIdx ][ i ] | ae(v) |
| if( CurrentPaletteSize[ startComp ] > 0 ) | |
|     palette_escape_val_present_flag | ae(v) |
| if( MaxPaletteIndex> 0 ) { | |
|     adjust = 0 | |
|     palette_transpose_flag | ae(v) |
| } | |
| if( treeType != DUAL_TREE_CHROMA&&palette_escape_val_present_flag ) { | |
|     if( cu_qp_delta_enabled_flag && !IsCuQpDeltaCoded ) { | |
|         cu_qp_delta_abs | ae(v) |
|         if( cu_qp_delta_abs ) | |
|             cu_qp_delta_sign_flag | ae(v) |
|     } | |
| } | |
| if( treeType != DUAL_TREE_LUMA&& palette_escape_val_present_flag ) { | |
|     if( cu_chroma_qp_offset_enabled_flag && !IsCuChromaQpOffsetCoded ) { | |
|         cu_chroma_qp_offset_flag | ae(v) |
|         if( cu_chroma_qp_offset_flag ) | |
|             cu_chroma_qp_offset_idx | ae(v) |
|     } | |
| } | |
| PreviousRunTypePosition = 0 | |
| PreviousRunType = 0 | |
| for(subSetId = 0; subSetId <= (cbWidth* cbHeight − 1) >> 4; subSetId++) { | |
|  minSubPos = subSetId << 4 | |
|  if(minSubPos + 16 > cbWidth * cbHeight) | |
|    maxSubPos = cbWidth * cbHeight | |
|  else | |
|    maxSubPos = minSubPos + 16 | |
|  RunCopyMap[ 0 ][ 0 ] = 0 | |
|    log2CbWidth = Log2( cbWidth ) | |
|    log2CbHeight = Log2( cbHeight ) | |
|  PaletteScanPos = minSubPos | |
|    while( PaletteScanPos < maxSubPos ) { | |
|       xC = x0 + TraverseScanOrder[ log2CbWidth ][ log2CbHeight ][ PaletteScanPos ][ 0 ] | |
|       yC = y0 + TraverseScanOrder[ log2CbWidth ][ log2CbHeight ][ PaletteScanPos ][ 1 ] | |
|       if( PaletteScanPos > 0 ) { | |
|          xcPrev = x0 + TraverseScanOrder[ log2CbWidth ][ log2CbHeight ][ PaletteScanPos − 1 ][ 0 ] | |
|          ycPrev = y0 + TraverseScanOrder[ log2CbWidth ][ log2CbHeight ][ PaletteScanPos − 1 ][ 1 ] | |
|       } | |
|     if ( MaxPaletteIndex> 0 && PaletteScanPos > 0) { | |
|       run_copy_flag | ae(v) |
|       RunCopyMap[ xC ][yC ] = run_copy_flag | |
|     } | |
|       CopyAboveIndicesFlag[ xC ] [ yC ] = 0 | |
|        if( MaxPaletteIndex > 0 && ! RunCopyMap[startComp][xC][yC] ) { | |
|          if( ( ( !palette_transpose_flag && yC > 0 ) || ( palette_transpose_flag && xC >0 ) ) | |
|            && CopyAboveIndicesFlag[ xcPrev ][ ycPrev ] == 0 ){ | |
|             copy_above_palette_indices_flag | ae(v) |
|             CopyAboveIndicesFlag[ xC ][ yC ] = copy_above_palette_indices_flag | |
|        } | |
|       PreviousRunType = CopyAboveIndicesFlag[ xC ][ yC ] | |
|       PreviousRunTypePosition = curPos | |
|     } else { | |
|        CopyAboveIndicesFlag[ xC ][ yC ] = Copy AboveIndicesFlag[xcPrev][ycPrev] | |
|       } | |
|     } | |
|    PaletteScanPos ++ | |
|  } | |
|  PaletteScanPos = minSubPos | |
|   while( PaletteScanPos < maxSubPos ) { | |
|       xC = x0 + TraverseScanOrder[ log2CbWidth ][ log2CbHeight ][ PaletteScanPos ][ 0 ] | |
|       yC = y 0 + TraverseScanOrder[ log2CbWidth ][ log2CbHeight ][ PaletteScanPos ][ 1 ] | |
|       if( PaletteScanPos > 0) { | |
|          xcPrev = x0 + TraverseScanOrder[ log2CbWidth ][ log2CbHeight ][ PaletteScanPos − 1 ][ 0 ] | |
|          ycPrev = y0 + TraverseScanOrder[ log2CbWidth ][ log2CbHeight ][ PaletteScanPos − 1 ][ 1 ] | |
|       } | |

|  | Descriptor |
|---|---|
| ```
        if ( MaxPaletteIndex > 0 ) {
            if ( ! RunCopyMap [ xC ][ yC ] && CopyAboveIndicesFlag[ xC ][ yC ] = = 0) {
                if( MaxPaletteIndex-adjust > 0) {
                    palette_idx_idc
                }
                adjust= 1
            }
        }
    }
    if (! RunCopyMap [ xC ][ yC ] && CopyAboveIndicesFlag[ xC ][ yC ] = = 0 ) {
        CurrPaletteIndex = palette_idx_idc
    if( CopyAboveIndicesFlag[ xC ][ yC ] = = 0 ) {
            PaletteIndexMap[ xC ][ yC ] = CurrPaletteIndex
        } else {
            if ( !palette_transpose_flag )
                PaletteIndexMap[ xC ][ yC ] = PaletteIndexMap[ xC ] [ yC − 1 ]
            else
                PaletteIndexMap[ xC ][ yC ] = PaletteIndexMap[xC − 1 ][ yC ]
        }
    }
    if( palette_escape_val_present_flag ) {
        for( cIdx = startComp; cIdx < ( startComp + num Comps ); cIdx++ )
            for( sPos = minSubPos; sPos<maxSubPos; sPos++ ) {
                xC = x0 + TraverseScanOrder[ log2CbWidth ][ log2CbHeight ][ sPos ][ 0 ]
                yC = y0 + TraverseScanOrder[ log2CbWidth ][ log2CbHeight ][ sPos ][ 1 ]
                if( PaletteIndexMap[ cIdx ][ xC ][ yC ] = = MaxPaletteIndex ) {
                    palette_escape_val
                    PaletteEscapeVal[ cIdx ][ xC ][ yC ] = palette_escape_val
                }
            }
        }
    }
}
``` | ae(v)<br><br><br><br><br><br><br><br><br><br><br><br><br><br><br><br><br><br><br>ae(v) |

Palette Coding Semantics

In the following semantics, the array indices x0, y0 specify the location (x0, y0) of the top-left luma sample of the considered coding block relative to the top-left luma sample of the picture. The array indices xC, yC specify the location (xC, yC) of the sample relative to the top-left luma sample of the picture. The array index startComp specifies the first colour component of the current palette table. startComp equal to 0 indicates the Y component; startComp equal to 1 indicates the Cb component; startComp equal to 2 indicates the Cr component. numComps specifies the number of colour components in the current palette table.

The predictor palette consists of palette entries from previous coding units that are used to predict the entries in the current palette.

The variable PredictorPaletteSize[startComp] specifies the size of the predictor palette for the first colour component of the current palette table startComp. PredictorPaletteSize is derived as specified in clause 8.4.5.3.

The variable PalettePredictorEntryReuseFlags[i] equal to 1 specifies that the i-th entry in the predictor palette is reused in the current palette. PalettePredictorEntryReuseFlags[i] equal to 0 specifies that the i-th entry in the predictor palette is not an entry in the current palette. All elements of the array PalettePredictorEntryReuseFlags[i] are initialized to 0.

palette_predictor_run is used to determine the number of zeros that precede a non-zero entry in the array PalettePredictorEntryReuseFlags.

It is a requirement of bitstream conformance that the value of palette_predictor_run shall be in the range of 0 to (PredictorPaletteSize−predictorEntryIdx), inclusive, where predictorEntryIdx corresponds to the current position in the array PalettePredictorEntryReuseFlags. The variable NumPredictedPaletteEntries specifies the number of entries in the current palette that are reused from the predictor palette. The value of NumPredictedPaletteEntries shall be in the range of 0 to palette_max_size, inclusive.

num_signalled_palette_entries specifies the number of entries in the current palette that are explicitly signalled for the first colour component of the current palette table startComp. When num_signalled_palette entries is not present, it is inferred to be equal to 0. The variable CurrentPaletteSize[startComp] specifies the size of the current palette for the first colour component of the current palette table startComp and is derived as follows:

$$\text{CurrentPaletteSize}[\text{startComp}] = \text{NumPredictedPaletteEntries} + \text{num\_signalled\_palette entries} \quad (7\text{-}155)$$

The value of CurrentPaletteSize[startComp] shall be in the range of 0 to palette_max_size, inclusive.

new_palette_entries[cIdx][i] specifies the value for the i-th signalled palette entry for the colour component cIdx.

The variable PredictorPaletteEntries[cIdx][i] specifies the i-th element in the predictor palette for the colour component cIdx.

The variable CurrentPaletteEntries[cIdx][i] specifies the i-th element in the current palette for the colour component cIdx and is derived as follows:

```
numPredictedPaletteEntries = 0
for( i = 0; i < PredictorPaletteSize[ startComp ]; i++ )
    if( PalettePredictorEntryReuseFlags[ i ] ) {
        for( cIdx =startComp; cIdx < ( startComp + numComps ); cIdx++ )
            CurrentPaletteEntries[ cIdx ][ numPredictedPaletteEntries ] =
              PredictorPaletteEntries[ cIdx ][ i ]
        numPredictedPaletteEntries++
    }
for( cIdx = startComp; cIdx < (startComp + numComps); cIdx++)(7-156)
    for( i = 0; i < num_signalled_palette_entries[startComp]; i++ )
        CurrentPaletteEntries[ cIdx ][ numPredictedPaletteEntries + i ] =
          new_palette_entries[ cIdx ][ i ]
``` palette_escape_val_present_flag equal to 1 specifies that the current coding unit contains at least one escape coded sample. escape_val_present_flag equal to 0 specifies that there are no escape coded samples in the current coding unit. When not present, the value of palette_escape_val_present_flag is inferred to be equal to 1.

The variable MaxPaletteIndex specifies the maximum possible value for a palette index for the current coding unit. The value of MaxPaletteIndex is set equal to CurrentPaletteSize[startComp]−1+palette_escape_val_present_flag.

palette_idx_idc is an indication of an index to the palette table, CurrentPaletteEntries. The value of palette_idx_idc shall be in the range of 0 to MaxPaletteIndex, inclusive, for the first index in the block and in the range of 0 to (MaxPaletteIndex−1), inclusive, for the remaining indices in the block.

When palette_idx_idc is not present, it is inferred to be equal to 0.

palette_transpose_flag equal to 1 specifies that vertical traverse scan is applied for scanning the indices for samples in the current coding unit. palette_transpose_flag equal to 0 specifies that horizontal traverse scan is applied for scanning the indices for samples in the current coding unit. When not present, the value of palette_transpose_flag is inferred to be equal to 0.

The array TraverseScanOrder specifies the scan order array for palette coding.

TraverseScanOrder is assigned the horizontal scan order HorTravScanOrder if palette_transpose_flag is equal to 0 and TraverseScanOrder is assigned the vertical scan order VerTravScanOrder if if palette_transpose_flag is equal to 1.

run_copy_flag equal to 1 specifies that the palette run type is the same the run type at the previously scanned position and palette run index is the same as the index at the previous position if copy_above_palette_indices_flag is equal to 0. Otherwise, run_copy_flag equal to 0 copy_above_palette_indices_flag equal to 1 specifies that the palette index is equal to the palette index at the same location in the row above if horizontal traverse scan is used or the same location in the left column if vertical traverse scan is used. copy_above_palette_indices_flag equal to 0 specifies that an indication of the palette index of the sample is coded in the bitstream or inferred.

The variable CopyAboveIndicesFlag[xC][yC] equal to 1 specifies that the palette index is copied from the palette index in the row above (horizontal scan) or left column (vertical scan). CopyAboveIndicesFlag[xC][yC] equal to 0 specifies that the palette index is explicitly coded in the bitstream or inferred. The array indices xC, yC specify the location (xC, yC) of the sample relative to the top-left luma sample of the picture.

The variable PaletteIndexMap[xC][yC] specifies a palette index, which is an index to the array represented by CurrentPaletteEntries. The array indices xC, yC specify the location (xC, yC) of the sample relative to the top-left luma sample of the picture. The value of PaletteIndexMap[xC][yC] shall be in the range of 0 to MaxPaletteIndex, inclusive.

The variable adjustedRefPaletteIndex is derived as follows:

```
adjustedRefPaletteIndex = MaxPaletteIndex +1
if( PaletteScanPos > 0) {
   xcPrev = x0 + Traverse Scan Order[ log2CbWidth ][ log2bHeight ][ PaletteScanPos − 1 ][ 0 ]
   ycPrev = y0 + TraverseScanOrder[ log2CbWidth ][ log2bHeight ][ PaletteScanPos − 1 ][ 1 ]
   if( CopyAboveIndicesFlag[ xcPrev ][ ycPrev ] = = 0 ) {
      adjustedRefPaletteIndex = PaletteIndexMap[ xcPrev ][ ycPrev ]   { (7-157)
   }
   else {
     if( !palette_transpose_flag)
        adjustedRefPaletteIndex = PaletteIndexMap[ xC ][ yC − 1 ]
     else
        adjustedRefPaletteIndex = PaletteIndexMap[ xC − 1 ][ yC ]
   }
}
```

When CopyAboveIndicesFlag[xC][yC] is equal to 0, the variable CurrPaletteIndex is derived as follows:

if(CurrPaletteIndex>=adjustedRefPaletteIndex)CurrPaletteIndex++     (7-158)

palette_escape_val specifies the quantized escape coded sample value for a component.

The variable PaletteEscapeVal[cIdx][xC][yC] specifies the escape value of a sample for which PaletteIndexMap[xC][yC] is equal to MaxPaletteIndex and palette_escape_val_present_flag is equal to 1. The array index cIdx specifies the colour component. The array indices xC, yC specify the location (xC, yC) of the sample relative to the top-left luma sample of the picture.

It is a requirement of bitstream conformance that PaletteEscapeVal[cIdx][xC][yC] shall be in the range of 0 to $(1<<(BitDepth_Y+1))-1$, inclusive, for cIdx equal to 0, and in the range of 0 to $(1<<(BitDepth_C+1))-1$, inclusive, for cIdx not equal to 0.

2.3 Local Dual Tree in VVC

In typical hardware video encoders and decoders, processing throughput drops when a picture has more small intra blocks because of sample processing data dependency between neighbouring intra blocks. The predictor generation of an intra block requires top and left boundary reconstructed samples from neighbouring blocks. Therefore, intra prediction has to be sequentially processed block by block.

In HEVC, the smallest intra CU is 8×8 luma samples. The luma component of the smallest intra CU can be further split into four 4×4 luma intra prediction units (PUs), but the chroma components of the smallest intra CU cannot be further split. Therefore, the worst case hardware processing throughput occurs when 4×4 chroma intra blocks or 4×4 luma intra blocks are processed.

In VTM5.0, in single coding tree, since chroma partitions always follows luma and the smallest intra CU is 4×4 luma samples, the smallest chroma intra CB is 2×2. Therefore, in VTM5.0, the smallest chroma intra CBs in single coding tree is 2×2. The worst case hardware processing throughput for VVC decoding is only ¼ of that for HEVC decoding. Moreover, the reconstruction process of a chroma intra CB becomes much more complex than that in HEVC after adopting tools including cross-component linear model (CCLM), 4-tap interpolation filters, position-dependent intra prediction combination (PDPC), and combined inter intra prediction (CIIP). It is challenging to achieve high processing throughput in hardware decoders. In this section, a method that improve the worst case hardware processing throughput is proposed.

The goal of this method is to disallow chroma intra CBs smaller than 16 chroma samples by constraining the partitioning of chroma intra CBs.

In single coding tree, a SCIPU is defined as a coding tree node whose chroma block size is larger than or equal to TH chroma samples and has at least one child luma block smaller than 4TH luma samples, where TH is set to 16 in this contribution. It is required that in each SCIPU, all CBs are inter, or all CBs are non-inter, i.e, either intra or IBC. In case of a non-inter SCIPU, it is further required that chroma of the non-inter SCIPU shall not be further split and luma of the SCIPU is allowed to be further split. In this way, the smallest chroma intra CB size is 16 chroma samples, and 2×2, 2×4, and 4×2 chroma CBs are removed. In addition, chroma scaling is not applied in case of a non-inter SCIPU. In addition, when luma blocks are further split and chroma blocks are not split, a local dual tree coding structure is constructed.

Figures 7A, 7B:
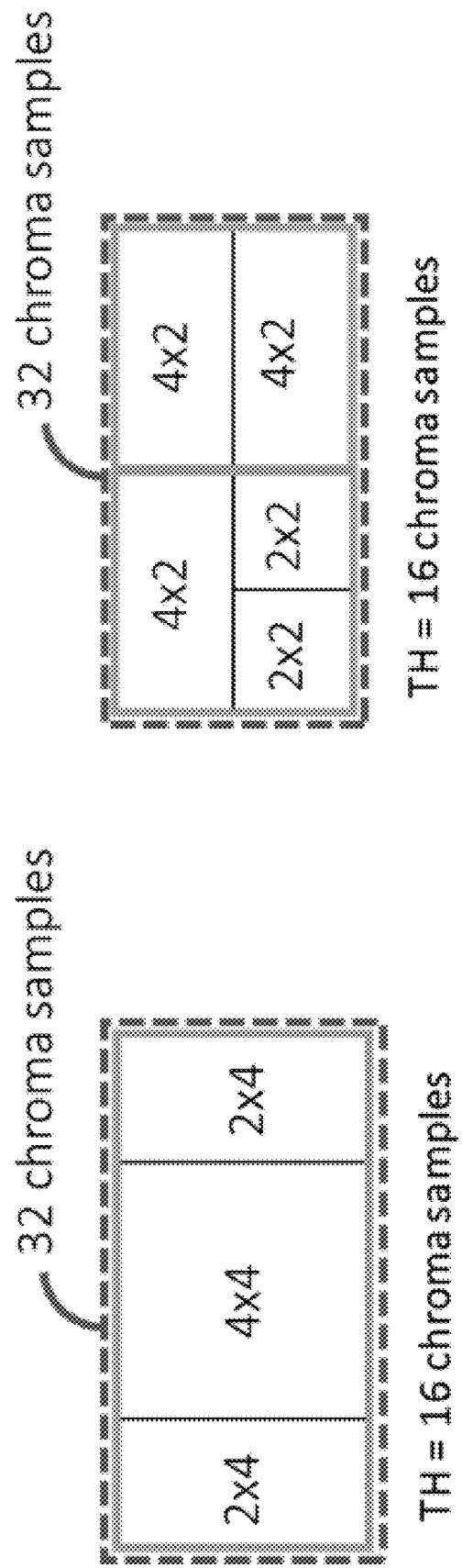
FIGS. 7A and 7B show examples of a smallest chroma inter prediction unit (SCIPU).

Two SCIPU examples are shown in FIGS. 7A and 7B. In FIG. 7A, one chroma CB of 8×4 chroma samples and three luma CBs (4×8, 8×8, 4×8 luma CBs) form one SCIPU because the ternary tree (TT) split from the 8×4 chroma samples would result in chroma CBs smaller than 16 chroma samples. In FIG. 7B, one chroma CB of 4×4 chroma samples (the left side of the 8×4 chroma samples) and three luma CBs (8×4, 4×4, 4×4 luma CBs) form one SCIPU, and the other one chroma CB of 4×4 samples (the right side of the 8×4 chroma samples) and two luma CBs (8×4, 8×4 luma CBs) form one SCIPU because the binary tree (BT) split from the 4×4 chroma samples would result in chroma CBs smaller than 16 chroma samples.

In the proposed method, the type of a SCIPU is inferred to be non-inter if the current slice is an I-slice or the current SCIPU has a 4×4 luma partition in it after further split one time (because no inter 4×4 is allowed in VVC); otherwise, the type of the SCIPU (inter or non-inter) is indicated by one signalled flag before parsing the CUs in the SCIPU.

By applying the above method, the worst-case hardware processing throughput occurs when 4×4, 2×8, or 8×2 chroma blocks, instead of a 2×2 chroma blocks, are processed. The worst-case hardware processing throughput is the same as that in HEVC and is 4× of that in VTM5.0.

3. Examples of Problems Solved by Embodiments

Figure 8:
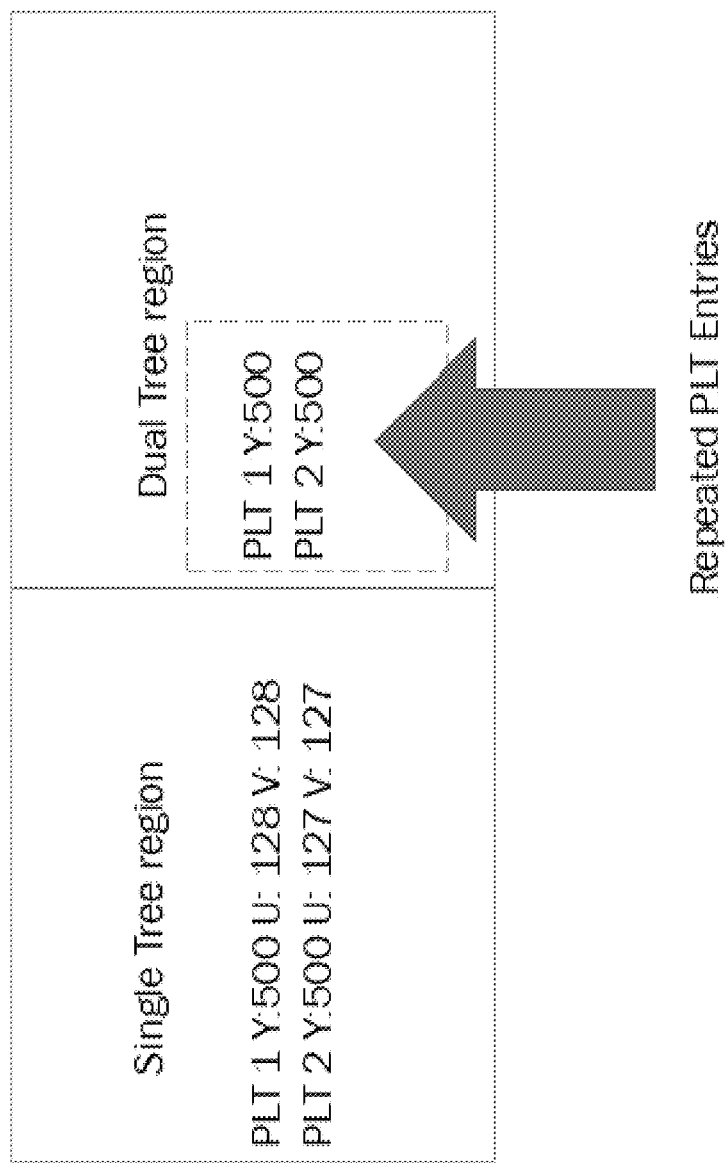
FIG. 8 shows an example of the repeated palette (PLT) entries problem in the local dual tree case.

1. To reduce the bandwidth cost, the IBC only could refer a block in the left coding tree unit (CTU) and above CTU as the prediction block in VVC, which limit the performance of IBC mode on screen content coding.
2. The binarization depends on the escape flag which is signalled at CU-level and one index usually costs more bits when escape flag is true. However, some CGs may not have escape samples so some bits could be saved which is not considered by the current design.
3. The local dual tree and PLT could not be applied simultaneously since some palette entries may be repeated when coding from a single tree region to a dual tree region. One example is shown in FIG. 8.
4. The number of entries in the palette predictor and the number of maximal allowed palette entries are fixed, which may lose the flexibility to control the efficiency and throughput of the palette mode.

4. Examples of Embodiments

The detailed inventions below should be considered as examples to explain general concepts. These inventions should not be interpreted in a narrow way. Furthermore, these inventions can be combined in any manner.

DCM

Figure 9:
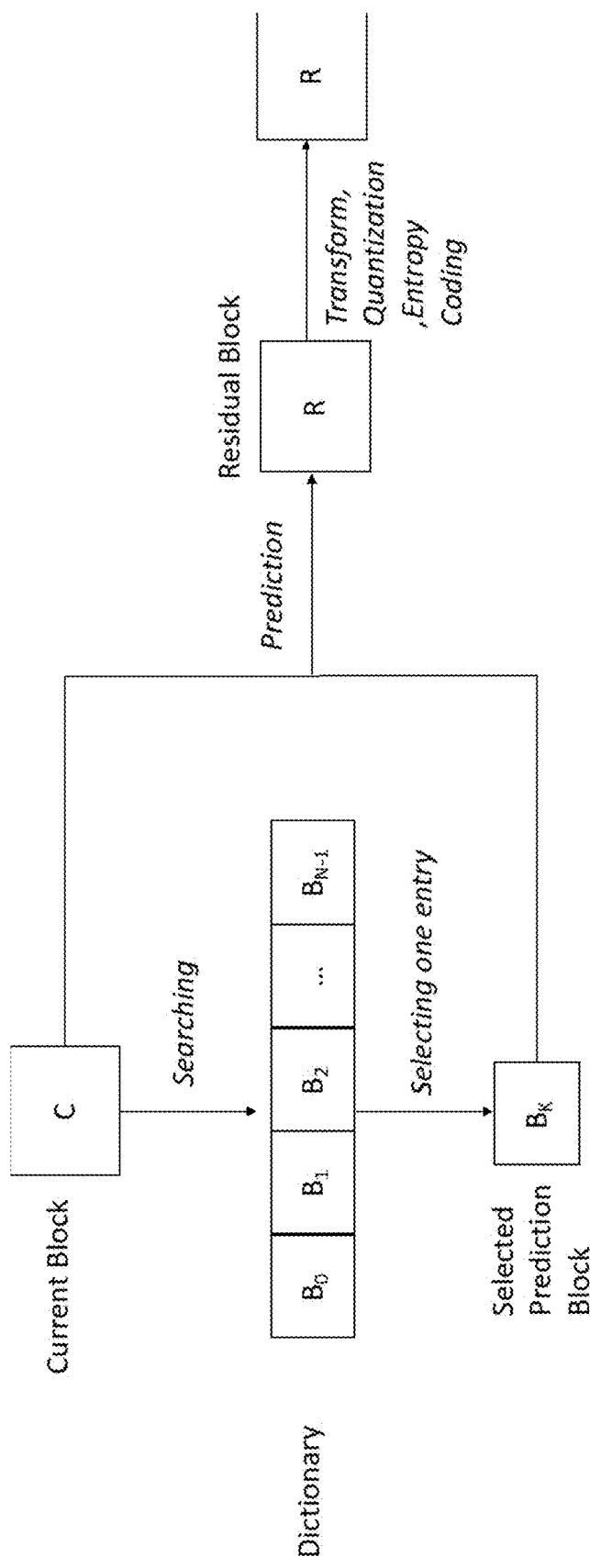
FIG. 9 shows an example of the coding process for a dictionary-based coding mode.
Figure 11:
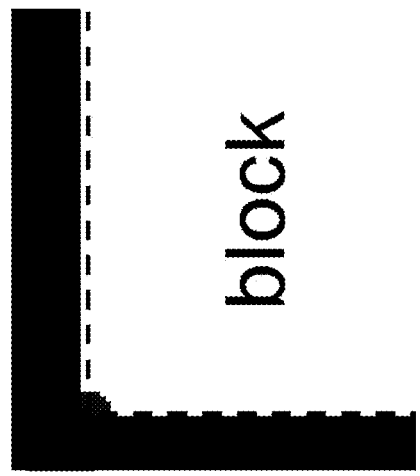
FIG. 11 shows an example of a template of a block.
Figure 10:
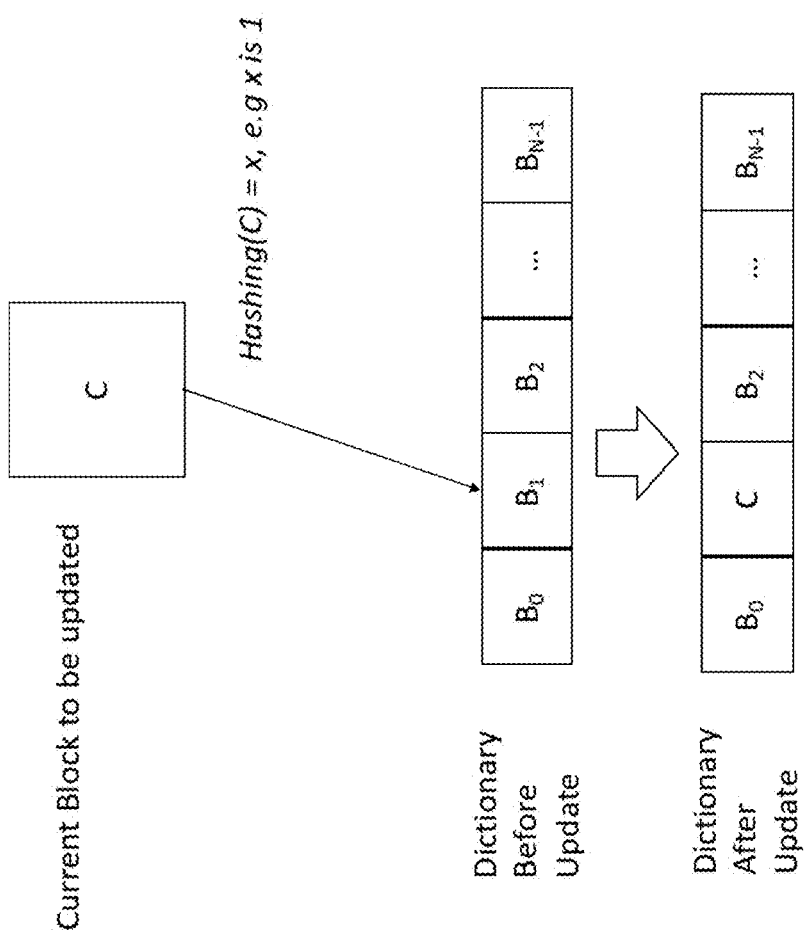
FIG. 10 shows an example of the updating process for a dictionary-based coding mode.

1. The DCM may be treated as a new prediction mode in additional to existing ones (e.g., intra/inter/IBC prediction modes).
    a. In one example, the DCM may be treated as part of a selected existing prediction mode (e.g., IBC prediction mode).
        i. Alternatively, furthermore, when the selected existing prediction mode is utilized, indication of the usage of the DCM may be further signaled.
        ii. In one example, indication of the usage of the DCM may be context coded or bypass coded.
    b. Alternatively, in one example, indication of the usage of the DCM may be signalled/parsed as a separate prediction mode (e.g. MODE DCM).
    c. In one example, indication of the usage of the DCM may be signalled/parsed under certain conditions.
        i. Indication of the usage of the DCM may be signalled/parsed under condition check of the block dimension.
            1. In one example, it may be signalled only when the block size is smaller than or equal to M×N.
                a) Alternatively, in one example, it may be signalled only when the width of a block is smaller than or equal to M and/or the height of a block is smaller than or equal to N.
        ii. Indication of the usage of the DCM may be signalled/parsed under condition check of the position of a block.
            1. In one example, it may be signalled only when vertical and/or horizontal coordinator of the top-left sample in a block are not equal to 0, e.g., relative to the slice/tile/brick containing the block.
            2. In one example, it may be signalled only for the blocks not contained in the first CTU, e.g., in the slice/tile/brick containing the block.
        iii. Indication of the usage of the DCM may be signalled/parsed under the condition check of previously coded information.
            1. In one example, it may be signalled only for luma blocks when dual tree coding structure is applied.
2. Multiple dictionaries may be utilized, and how to select a dictionary for a block may depend on the coded information (e.g., according to block dimension or signaled values in a bitstream).
    a. In one example, for blocks with same coded information (e.g., same block width and height), multiple dictionaries may be utilized.
        i. Alternatively, furthermore, an index of multiple dictionaries may be signaled/parsed in the bitstream.
    b. In one example, for blocks with same coded information (e.g., same block width and height), only a dictionary may be utilized while for blocks with different coded information, different dictionaries may be utilized.
　　i. In one example, for a block with K*L dimension, the first dictionary is utilized while for another block with M*N (wherein M!=K and/or N!=L), a second dictionary is utilized.
3. A dictionary used in DCM may contain one or multiple entries.
　a. The maximum number of entries in a dictionary may be pre-defined or signaled in the bitstream.
　b. In one example, an entry of the dictionary may contain multiple samples/pixels, e.g, K*L samples/pixels.
　c. In one example, an entry of the dictionary may be a block in the reconstructed region.
　　i. Alternatively, furthermore, the entry of the dictionary may be a luma block in the reconstructed region.
3. When the dictionary-based coding mode (DCM) is applied, the prediction block of a current block may be generated depending on an entry or more entries of one or multiple dictionaries.
　a. In one example, an entry in the dictionary may be used as a prediction block of the current block.
　　i. In one example, the index of this entry may be signalled to the decoder.
　　　1. Alternatively, in one example, the index of this entry may be inferred to N.
　　ii. In one example, how to select the best entry may be determined by minimizing a certain cost.
　　　1. In one example, the cost may denote the rate distortion cost between an entry and the current block.
　　　2. Alternatively, in one example, the cost may denote the distortion between an entry and the current block, such as SAD, SATD, SSE or MSE.
　b. In one example, the prediction block of a current block may be purely dependent on the entries in the dictionary.
　　i. Alternatively, the prediction block of a current block may be dependent on both of the dictionary and the reconstructed area in current picture which are not included to the dictionary.
　c. In one example, the process of DCM may be illustrated as in FIG. 9. In FIG. 9, the dictionary has N entries, and $B_i$ is the $i^{th}$ entry in the dictionary. The current block is denoted by C. The encoder may first check each entry $B_i$ (0<=i<=N−1) and determine a best prediction block for C under a certain criterion, which is denoted by $B_K$ in FIG. 9. After that, the corresponding residual block between C and $B_K$ may be transformed, quantized and/or entropy coded.
4. It is proposed to reset the dictionary before coding a slice/tile/picture then update the dictionary after coding a video unit.
　a. In one example, a video unit may be a block/CU/CTU/CTU row.
　b. In one example, all overlapped blocks with different block sizes contained in a video unit may be employed to update the dictionary.
　　i. Alternatively, in one example, only the blocks with size equal to M×N may be employed to update the dictionary.
　c. In one example, the hash function may be used to exclude similar/identical blocks from the dictionary.
　　i. In one example, the hash function may be a CRC function with N bits.
　　ii. In one example, following the raster order, only the latter block may be included to the dictionary if two blocks have a same hash value.
　　　1. Alternatively, in one example, both of two blocks may be included to the dictionary if they have a same hash value.
　　iii. In one example, the updating process of DCM may be illustrated as shown in FIG. 10. In FIG. 10, the dictionary has N entries, and $B_i$ is the $i^{th}$ entry in the dictionary. The current block is denoted by C. let x be the hash value of C. When using C to update the dictionary, x is first derived and then the entry on the $x^{th}$ position may be filled with/replaced by C. In FIG. 10, x is equal to 1, thus the entry $B_1$ may be replaced by C in this example.
　　iv. In one example, each entry in the dictionary may be a block list to store blocks with same hash values.
　　　1. In one example, the list may be updated with first in first out (FIFO) strategy.
　　　2. In one example, the list size may be equal to M.
　　　　a. In one example, M may be set equal to 1.
5. Entries in a dictionary may be firstly sorted before being used to derive prediction/reconstruction of a current block.
　a. It is proposed to sort the entries in the dictionary based on the distortion between the template of each entry and the template of the current block.
　b. In one example, as shown in FIG. 11, if the current block is S1×S2, the template may denote a M×N region excluding the region of the current block, where M>S1 and N>S2.
　c. In one example, the distortion in the above example may denote the distortion between two templates, such as SAD, SATD, SSE or MSE.
　d. In one example, the entry may not only include a block in the reconstructed region but also include the template of the block.
　e. In one example, the dictionary may be sorted in an ascending/descending order based on the template distortion cost.
　f. In one example, after sorting the dictionary in a descending order based on the template distortion cost, only the first K entries could be applied when coding the current block with DCM.
　　i. In one example, supposing the dictionary size is N, the index range may be decreased from [0, N−1] to [0, K−1].
6. For a block coded with DCM, the selected entry index/indices may be explicitly signaled or implicitly signaled in the bitstream.
　a. In one example, fixed length coding/Exp-Golomb/truncated unary/truncated binary may be used to binarize the entry index.
　b. The binarization of the signalled index in DCM may depend the number of possible entries used in DCM.
　　i. In one example, the binarization may be fixed length with M bits.
　　　1. In one example, M may be set equal to floor(log 2(N)).
　　　　a. In one example, log 2(N) is a function to get the logarithm of N to the base 2.
　　　　b. In one example, floor(N) is a function to get the nearest integer upbound of N.

ii. In one example, the binarization may be truncated binary/unary with cMax equal to N.

iii. In the above examples, N may be the number of all entries in the dictionary.

1. Alternatively, N may be the number of available entries in the dictionary, such as the K in the bullet 5.f.

Escape Flag in the Line-Based CG Modes for Palette Mode

7. Whether these are escape samples may be indicated for each CG and the escape flags for CGs may be coded together.

a. In one example, the syntax element e.g palette escape_val_present_flag, may be signalled at CG-level.

i. In one example, one flag may be first signalled to indicate whether the escape flags of all CGs are false. If there is any escape flag equal to true, the escape flags of each CG may be further signalled.

ii. In one example, the index of escape flags equal to true may be signalled.

iii. In one example, the index of escape flags equal to false may be signalled.

b. Alternatively, a block-based flag to indicate whether there are escape samples may be sent.

i. In one example, when the block-based flag indicates that there is no escape samples, CG-level escape sample presence flags may be skipped.

c. The value of escape flags of all CGs in a block may be concatenated and coded together.

i. In one example, each bit of a variable, E, represents an escape sample presence flag of a CG.

ii. In one example, fixed length binarization may be used to code the E.

1. Alternatively, in one example, truncated unary binarization may be used to code the E.

2. Alternatively, in one example, the binarization of exp Golomb with $K^{th}$ order may be used to code the E.

iii. In one example, E may be bypass coded or context coded.

Palette Predictor Related

8. It is proposed to save and load the palette predictor based on the usage of local dual tree.

a. In one example, the palette predictor may be saved to a temporary buffer when single tree is switched to local dual tree, that is, after decoding the last block in a single tree or before decoding a first block in a local dual tree.

i. In one example, the palette predictor may be reset before being used to decode a first block in a local dual tree.

b. In one example, the palette predictor may be loaded from the temporary buffer when local dual tree is switched to single tree, that is, after decoding the last block in a local dual tree or before decoding a first block in a single tree.

9. It is proposed to signal the maximal allowed palette size in the DPS/SPS/VPS/PPS/APS/picture header/slice header/tile group header/Largest coding unit (LCU)/Coding unit (CU)/LCU row/group of LCUs/TU/PU block/Video coding unit.

10. It is proposed to signal the maximal allowed size of palette predictor in the DPS/SPS/VPS/PPS/APS/picture header/slice header/tile group header/Largest coding unit (LCU)/Coding unit (CU)/LCU row/group of LCUs/TU/PU block/Video coding unit.

Technical Solutions Applicable to all of the Above Items

11. The M, N, K and/or L in the above examples may be integer numbers.

a. In one example, both of M and N may be equal to 4.

1. In one example, N may be a pre-defined constant value for all QPs.

2. In one example, N may be signalled to the decoder.

3. In one example, N may be based on a. Video contents (e.g. screen contents or natural contents)

b. A message signaled in the DPS/SPS/VPS/PPS/APS/picture header/slice header/tile group header/Largest coding unit (LCU)/Coding unit (CU)/LCU row/group of LCUs/TU/PU block/Video coding unit c. Position of CU/PU/TU/block/Video coding unit d. Block dimension of current block and/or its neighboring blocks e. Block shape of current block and/or its neighboring blocks f. Quantization parameter of the current block g. Indication of the color format (such as 4:2:0, 4:4:4, RGB or YUV)

h. Coding tree structure (such as dual tree or single tree)

i. Slice/tile group type and/or picture type j. Color component (e.g. may be only applied on luma component and/or chroma component)

k. Temporal layer ID

12. Whether and/or how apply the above methods may be based on:

a. Video contents (e.g. screen contents or natural contents)

i. In one example, the above methods may be only applied on screen contents.

b. A message signaled in the DPS/SPS/VPS/PPS/APS/picture header/slice header/tile group header/Largest coding unit (LCU)/Coding unit (CU)/LCU row/group of LCUs/TU/PU block/Video coding unit c. Position of CU/PU/TU/block/Video coding unit d. Block dimension of current block and/or its neighboring blocks e. Block shape of current block and/or its neighboring blocks f. Quantization parameter of the current block g. Indication of the color format (such as 4:2:0, 4:4:4, RGB or YUV)

h. Coding tree structure (such as dual tree or single tree)

i. Slice/tile group type and/or picture type j. Color component (e.g. may be only applied on luma component and/or chroma component)

k. Temporal layer ID l. Profiles/Levels/Tiers of a standard

The examples described above may be incorporated in the context of the method described below, e.g., methods 1200 and 1300, which may be implemented at a video decoder or a video encoder.

FIG. 12 shows a flowchart of an exemplary method 1200 for video processing. The method 1200 includes, at operation 1210, performing a conversion between a current block of a video and a bitstream representation of the video, the conversion using a dictionary-based coding mode that maintains or updates one or more dictionaries during an encoding and/or decoding process for the current block, and the conversion being based on the one or more dictionaries.

FIG. 13 shows a flowchart of an exemplary method 1300 for video processing. The method 1300 includes, at operation 1310, performing a conversion between a current block of a video coded using a palette mode and a bitstream representation of the video, the conversion comprising saving and loading a palette predictor of a palette in the palette mode based on a usage of a local dual tree in the conversion.

Figure 14A:
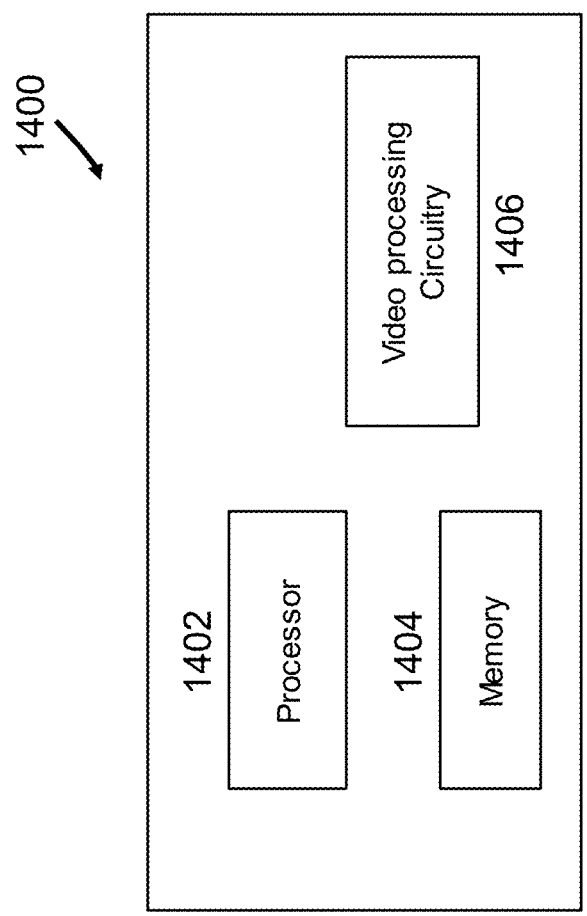
FIG. 14A is a block diagram of an example of a video processing apparatus.

FIG. 14A is a block diagram of a video processing apparatus 1400. The apparatus 1400 may be used to implement one or more of the methods described herein. The apparatus 1400 may be embodied in a smartphone, tablet, computer, Internet of Things (IoT) receiver, and so on. The apparatus 1400 may include one or more processors 1402, one or more memories 1404 and video processing hardware 1406. The processor(s) 1402 may be configured to implement one or more methods described in the present document. The memory (memories) 1404 may be used for storing data and code used for implementing the methods and techniques described herein. The video processing hardware 1406 may be used to implement, in hardware circuitry, some techniques described in the present document.

Figure 14B:
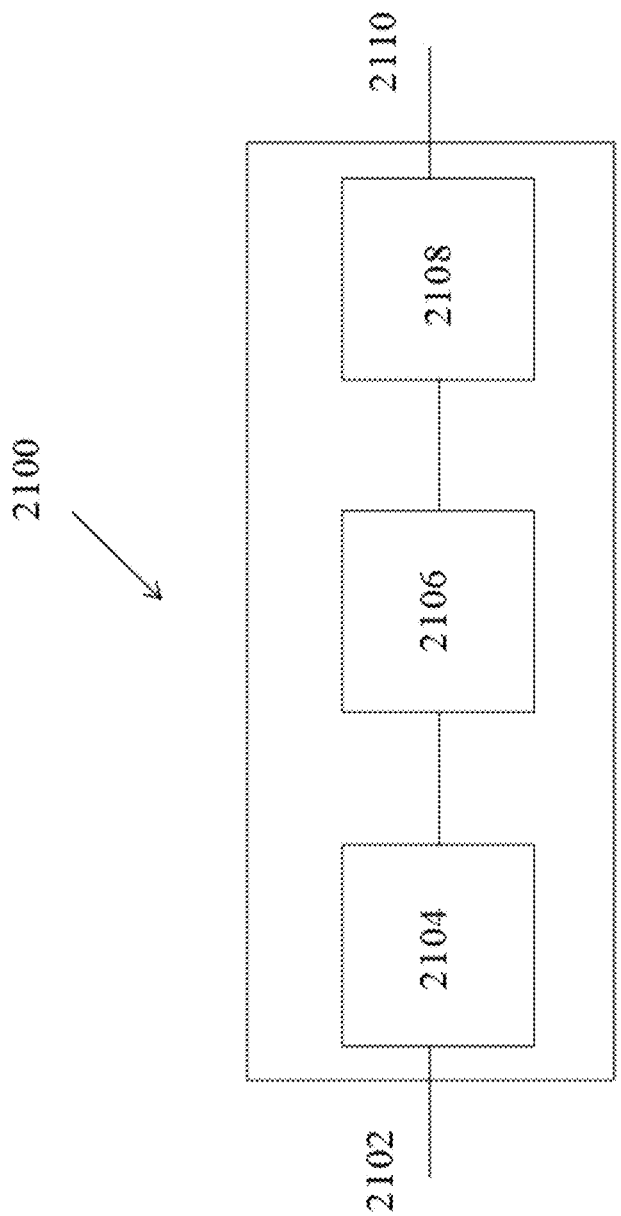
FIG. 14B is a block diagram of an example video processing system in which disclosed techniques may be implemented.

FIG. 14B is a block diagram showing an example video processing system 2100 in which various techniques disclosed herein may be implemented. Various implementations may include some or all of the components of the system 2100. The system 2100 may include input 2102 for receiving video content. The video content may be received in a raw or uncompressed format, e.g, 8 or 10 bit multi-component pixel values, or may be in a compressed or encoded format. The input 2102 may represent a network interface, a peripheral bus interface, or a storage interface. Examples of network interface include wired interfaces such as Ethernet, passive optical network (PON), etc. and wireless interfaces such as Wi-Fi or cellular interfaces.

The system 2100 may include a coding component 2104 that may implement the various coding or encoding methods described in the present document. The coding component 2104 may reduce the average bitrate of video from the input 2102 to the output of the coding component 2104 to produce a coded representation of the video. The coding techniques are therefore sometimes called video compression or video transcoding techniques. The output of the coding component 2104 may be either stored, or transmitted via a communication connected, as represented by the component 2106. The stored or communicated bitstream (or coded) representation of the video received at the input 2102 may be used by the component 2108 for generating pixel values or displayable video that is sent to a display interface 2110. The process of generating user-viewable video from the bitstream representation is sometimes called video decompression. Furthermore, while certain video processing operations are referred to as "coding" operations or tools, it will be appreciated that the coding tools or operations are used at an encoder and corresponding decoding tools or operations that reverse the results of the coding will be performed by a decoder.

Examples of a peripheral bus interface or a display interface may include universal serial bus (USB) or high definition multimedia interface (HDMI) or Displayport, and so on. Examples of storage interfaces include SATA (serial advanced technology attachment), PCI, IDE interface, and the like. The techniques described in the present document may be embodied in various electronic devices such as mobile phones, laptops, smartphones or other devices that are capable of performing digital data processing and/or video display.

Figure 15:
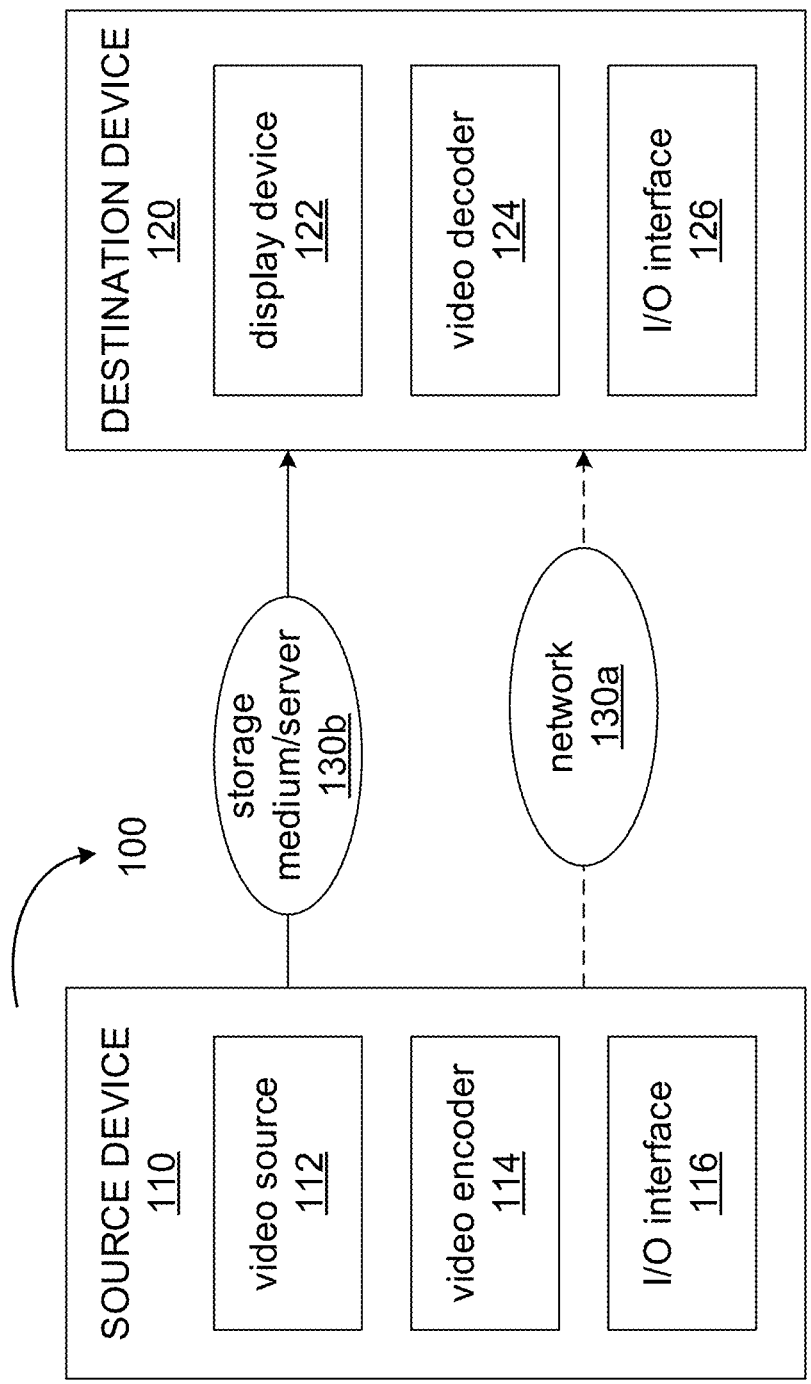
FIG. 15 is a block diagram that illustrates an example video coding system.

FIG. 15 is a block diagram that illustrates an example video coding system 100 that may utilize the techniques of this disclosure.

As shown in FIG. 15, video coding system 100 may include a source device 110 and a destination device 120. Source device 110 generates encoded video data which may be referred to as a video encoding device. Destination device 120 may decode the encoded video data generated by source device 110 which may be referred to as a video decoding device.

Source device 110 may include a video source 112, a video encoder 114, and an input/output (I/O) interface 116.

Video source 112 may include a source such as a video capture device, an interface to receive video data from a video content provider, and/or a computer graphics system for generating video data, or a combination of such sources. The video data may comprise one or more pictures. Video encoder 114 encodes the video data from video source 112 to generate a bitstream. The bitstream may include a sequence of bits that form a coded representation of the video data. The bitstream may include coded pictures and associated data. The coded picture is a coded representation of a picture. The associated data may include sequence parameter sets, picture parameter sets, and other syntax structures. I/O interface 116 may include a modulator/demodulator (modem) and/or a transmitter. The encoded video data may be transmitted directly to destination device 120 via I/O interface 116 through network 130a. The encoded video data may also be stored onto a storage medium/server 130b for access by destination device 120.

Destination device 120 may include an I/O interface 126, a video decoder 124, and a display device 122.

I/O interface 126 may include a receiver and/or a modem. I/O interface 126 may acquire encoded video data from the source device 110 or the storage medium/server 130b. Video decoder 124 may decode the encoded video data. Display device 122 may display the decoded video data to a user. Display device 122 may be integrated with the destination device 120, or may be external to destination device 120 which be configured to interface with an external display device.

Video encoder 114 and video decoder 124 may operate according to a video compression standard, such as the High Efficiency Video Coding (HEVC) standard, Versatile Video Coding (VVC) standard and other current and/or further standards.

Figure 16:
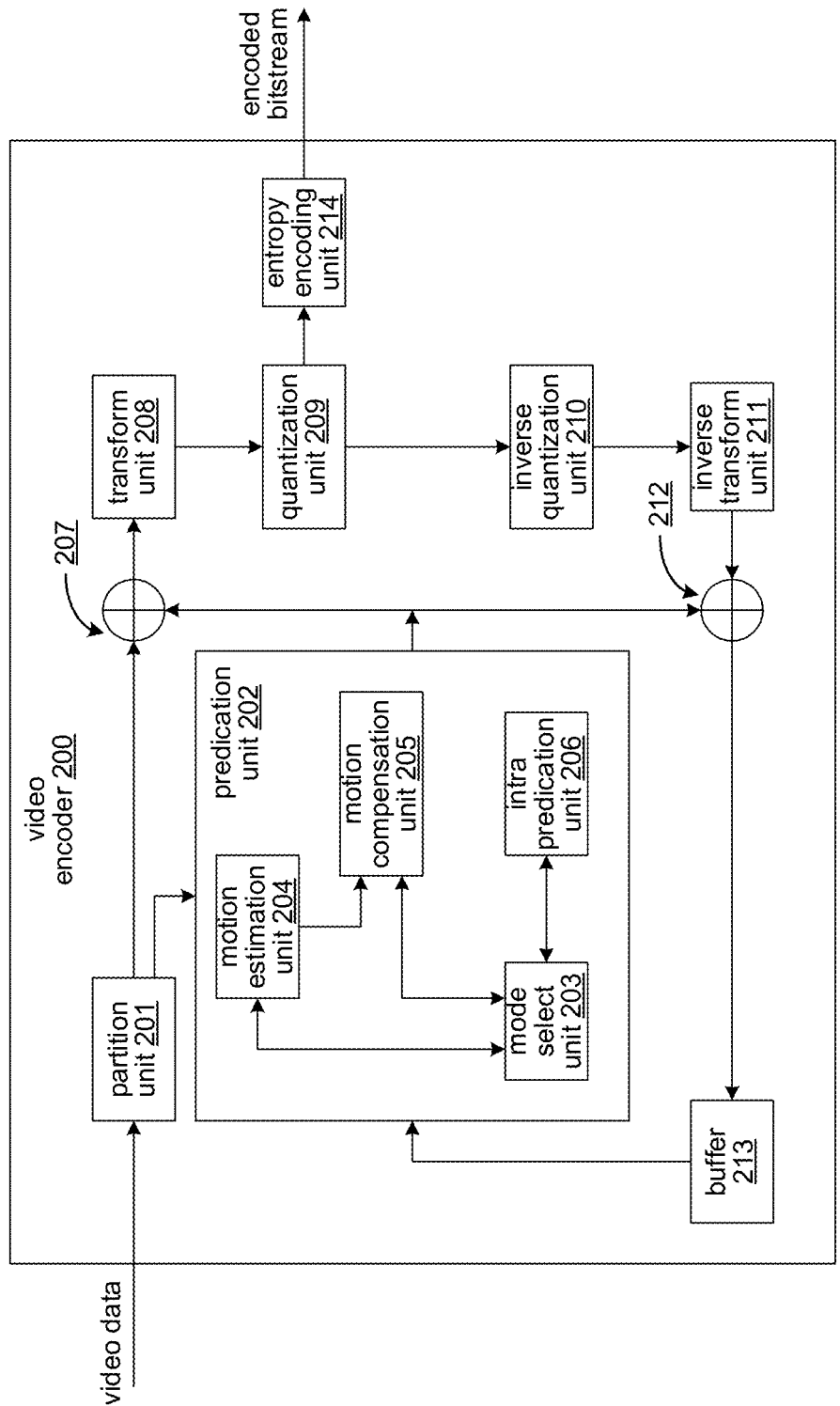
FIG. 16 is a block diagram that illustrates an encoder in accordance with some embodiments of the disclosed technology.

FIG. 16 is a block diagram illustrating an example of video encoder 200, which may be video encoder 114 in the system 100 illustrated in FIG. 15.

Video encoder 200 may be configured to perform any or all of the techniques of this disclosure. In the example of FIG. 16, video encoder 200 includes a plurality of functional components. The techniques described in this disclosure may be shared among the various components of video encoder 200. In some examples, a processor may be configured to perform any or all of the techniques described in this disclosure.

The functional components of video encoder 200 may include a partition unit 201, a predication unit 202 which may include a mode select unit 203, a motion estimation unit 204, a motion compensation unit 205 and an intra prediction unit 206, a residual generation unit 207, a transform unit 208, a quantization unit 209, an inverse quantization unit 210, an inverse transform unit 211, a reconstruction unit 212, a buffer 213, and an entropy encoding unit 214.

In other examples, video encoder 200 may include more, fewer, or different functional components. In an example, predication unit 202 may include an intra block copy (IBC) unit. The IBC unit may perform predication in an IBC mode in which at least one reference picture is a picture where the current video block is located.

Furthermore, some components, such as motion estimation unit 204 and motion compensation unit 205 may be highly integrated, but are represented in the example of FIG. 16 separately for purposes of explanation.

Partition unit 201 may partition a picture into one or more video blocks. Video encoder 200 and video decoder 300 may support various video block sizes.

Mode select unit 203 may select one of the coding modes, intra or inter, e.g., based on error results, and provide the resulting intra- or inter-coded block to a residual generation unit 207 to generate residual block data and to a reconstruction unit 212 to reconstruct the encoded block for use as a reference picture. In some example, Mode select unit 203 may select a combination of intra and inter predication (CIIP) mode in which the predication is based on an inter predication signal and an intra predication signal. Mode select unit 203 may also select a resolution for a motion vector (e.g., a sub-pixel or integer pixel precision) for the block in the case of inter-predication.

To perform inter prediction on a current video block, motion estimation unit 204 may generate motion information for the current video block by comparing one or more reference frames from buffer 213 to the current video block. Motion compensation unit 205 may determine a predicted video block for the current video block based on the motion information and decoded samples of pictures from buffer 213 other than the picture associated with the current video block.

Motion estimation unit 204 and motion compensation unit 205 may perform different operations for a current video block, for example, depending on whether the current video block is in an I slice, a P slice, or a B slice.

In some examples, motion estimation unit 204 may perform uni-directional prediction for the current video block, and motion estimation unit 204 may search reference pictures of list 0 or list 1 for a reference video block for the current video block. Motion estimation unit 204 may then generate a reference index that indicates the reference picture in list 0 or list 1 that contains the reference video block and a motion vector that indicates a spatial displacement between the current video block and the reference video block. Motion estimation unit 204 may output the reference index, a prediction direction indicator, and the motion vector as the motion information of the current video block. Motion compensation unit 205 may generate the predicted video block of the current block based on the reference video block indicated by the motion information of the current video block.

In other examples, motion estimation unit 204 may perform bi-directional prediction for the current video block, motion estimation unit 204 may search the reference pictures in list 0 for a reference video block for the current video block and may also search the reference pictures in list 1 for another reference video block for the current video block. Motion estimation unit 204 may then generate reference indexes that indicate the reference pictures in list 0 and list 1 containing the reference video blocks and motion vectors that indicate spatial displacements between the reference video blocks and the current video block. Motion estimation unit 204 may output the reference indexes and the motion vectors of the current video block as the motion information of the current video block. Motion compensation unit 205 may generate the predicted video block of the current video block based on the reference video blocks indicated by the motion information of the current video block.

In some examples, motion estimation unit 204 may output a full set of motion information for decoding processing of a decoder.

In some examples, motion estimation unit 204 may do not output a full set of motion information for the current video. Rather, motion estimation unit 204 may signal the motion information of the current video block with reference to the motion information of another video block. For example, motion estimation unit 204 may determine that the motion information of the current video block is sufficiently similar to the motion information of a neighboring video block.

In one example, motion estimation unit 204 may indicate, in a syntax structure associated with the current video block, a value that indicates to the video decoder 300 that the current video block has the same motion information as the another video block.

In another example, motion estimation unit 204 may identify, in a syntax structure associated with the current video block, another video block and a motion vector difference (MVD). The motion vector difference indicates a difference between the motion vector of the current video block and the motion vector of the indicated video block. The video decoder 300 may use the motion vector of the indicated video block and the motion vector difference to determine the motion vector of the current video block.

As discussed above, video encoder 200 may predictively signal the motion vector. Two examples of predictive signaling techniques that may be implemented by video encoder 200 include advanced motion vector predication (AMVP) and merge mode signaling.

Intra prediction unit 206 may perform intra prediction on the current video block. When intra prediction unit 206 performs intra prediction on the current video block, intra prediction unit 206 may generate prediction data for the current video block based on decoded samples of other video blocks in the same picture. The prediction data for the current video block may include a predicted video block and various syntax elements.

Residual generation unit 207 may generate residual data for the current video block by subtracting (e.g., indicated by the minus sign) the predicted video block(s) of the current video block from the current video block. The residual data of the current video block may include residual video blocks that correspond to different sample components of the samples in the current video block.

In other examples, there may be no residual data for the current video block for the current video block, for example in a skip mode, and residual generation unit 207 may not perform the subtracting operation.

Transform processing unit 208 may generate one or more transform coefficient video blocks for the current video block by applying one or more transforms to a residual video block associated with the current video block.

After transform processing unit 208 generates a transform coefficient video block associated with the current video block, quantization unit 209 may quantize the transform coefficient video block associated with the current video block based on one or more quantization parameter (QP) values associated with the current video block.

Inverse quantization unit 210 and inverse transform unit 211 may apply inverse quantization and inverse transforms to the transform coefficient video block, respectively, to reconstruct a residual video block from the transform coefficient video block. Reconstruction unit 212 may add the reconstructed residual video block to corresponding samples from one or more predicted video blocks generated by the predication unit 202 to produce a reconstructed video block associated with the current block for storage in the buffer 213.

After reconstruction unit 212 reconstructs the video block, loop filtering operation may be performed reduce video blocking artifacts in the video block.

Entropy encoding unit 214 may receive data from other functional components of the video encoder 200. When entropy encoding unit 214 receives the data, entropy encoding unit 214 may perform one or more entropy encoding operations to generate entropy encoded data and output a bitstream that includes the entropy encoded data.

Figure 17:
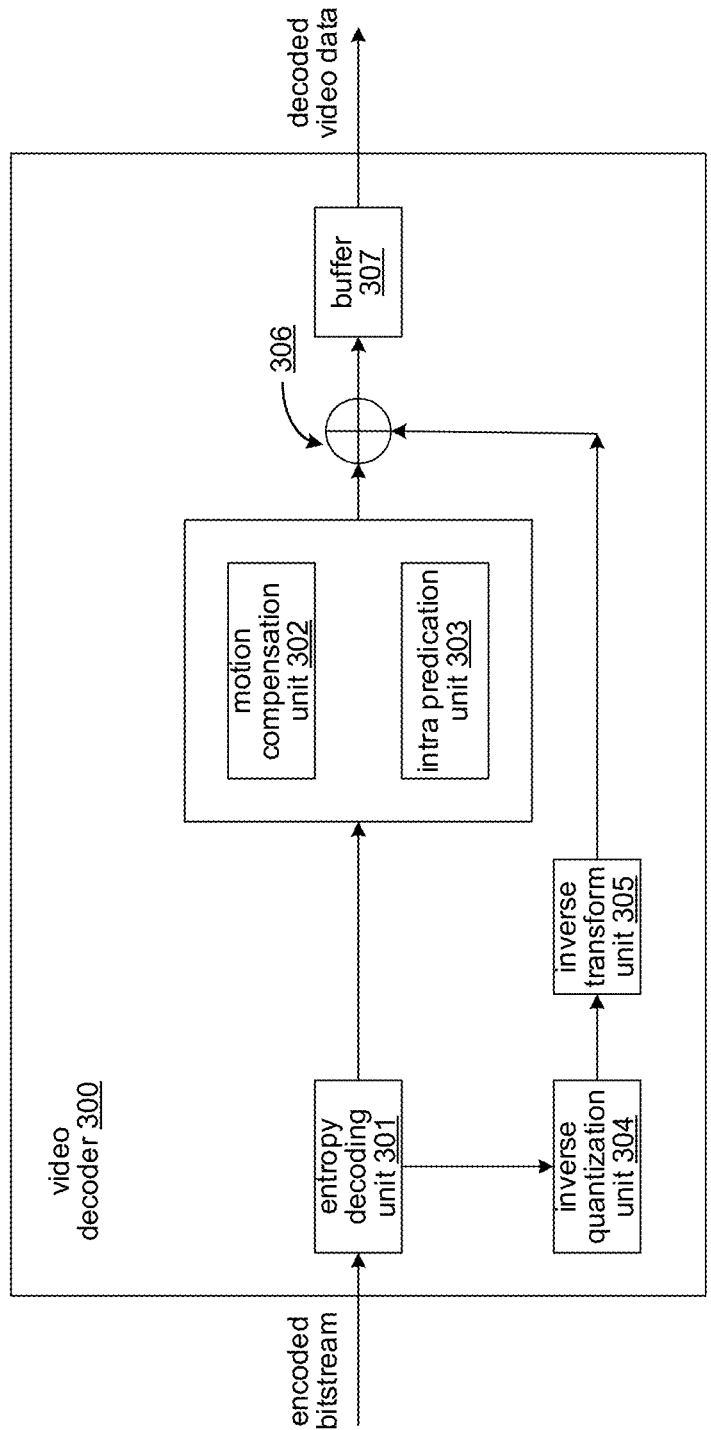
FIG. 17 is a block diagram that illustrates a decoder in accordance with some embodiments of the disclosed technology.

FIG. 17 is a block diagram illustrating an example of video decoder 300 which may be video decoder 114 in the system 100 illustrated in FIG. 15.

The video decoder 300 may be configured to perform any or all of the techniques of this disclosure. In the example of FIG. 17, the video decoder 300 includes a plurality of functional components. The techniques described in this disclosure may be shared among the various components of the video decoder 300. In some examples, a processor may be configured to perform any or all of the techniques described in this disclosure.

In the example of FIG. 17, video decoder 300 includes an entropy decoding unit 301, a motion compensation unit 302, an intra prediction unit 303, an inverse quantization unit 304, an inverse transformation unit 305, and a reconstruction unit 306 and a buffer 307. Video decoder 300 may, in some examples, perform a decoding pass generally reciprocal to the encoding pass described with respect to video encoder 200 (e.g., FIG. 16).

Entropy decoding unit 301 may retrieve an encoded bitstream. The encoded bitstream may include entropy coded video data (e.g., encoded blocks of video data). Entropy decoding unit 301 may decode the entropy coded video data, and from the entropy decoded video data, motion compensation unit 302 may determine motion information including motion vectors, motion vector precision, reference picture list indexes, and other motion information. Motion compensation unit 302 may, for example, determine such information by performing the AMVP and merge mode.

Motion compensation unit 302 may produce motion compensated blocks, possibly performing interpolation based on interpolation filters. Identifiers for interpolation filters to be used with sub-pixel precision may be included in the syntax elements.

Motion compensation unit 302 may use interpolation filters as used by video encoder 20 during encoding of the video block to calculate interpolated values for sub-integer pixels of a reference block. Motion compensation unit 302 may determine the interpolation filters used by video encoder 200 according to received syntax information and use the interpolation filters to produce predictive blocks.

Motion compensation unit 302 may uses some of the syntax information to determine sizes of blocks used to encode frame(s) and/or slice(s) of the encoded video sequence, partition information that describes how each macroblock of a picture of the encoded video sequence is partitioned, modes indicating how each partition is encoded, one or more reference frames (and reference frame lists) for each inter-encoded block, and other information to decode the encoded video sequence.

Intra prediction unit 303 may use intra prediction modes for example received in the bitstream to form a prediction block from spatially adjacent blocks. Inverse quantization unit 303 inverse quantizes, i.e., de-quantizes, the quantized video block coefficients provided in the bitstream and decoded by entropy decoding unit 301. Inverse transform unit 303 applies an inverse transform.

Reconstruction unit 306 may sum the residual blocks with the corresponding prediction blocks generated by motion compensation unit 202 or intra-prediction unit 303 to form decoded blocks. If desired, a deblocking filter may also be applied to filter the decoded blocks in order to remove blockiness artifacts. The decoded video blocks are then stored in buffer 307, which provides reference blocks for subsequent motion compensation.

Some embodiments of the disclosed technology include making a decision or determination to enable a video processing tool or mode. In an example, when the video processing tool or mode is enabled, the encoder will use or implement the tool or mode in the processing of a block of video, but may not necessarily modify the resulting bitstream based on the usage of the tool or mode. That is, a conversion from the block of video to the bitstream representation of the video will use the video processing tool or mode when it is enabled based on the decision or determination. In another example, when the video processing tool or mode is enabled, the decoder will process the bitstream with the knowledge that the bitstream has been modified based on the video processing tool or mode. That is, a conversion from the bitstream representation of the video to the block of video will be performed using the video processing tool or mode that was enabled based on the decision or determination.

In the present document, the term "video processing" may refer to video encoding, video decoding, video compression or video decompression. For example, video compression algorithms may be applied during conversion from pixel representation of a video to a corresponding bitstream representation or vice versa. The bitstream representation of a current video block may, for example, correspond to bits that are either co-located or spread in different places within the bitstream, as is defined by the syntax. For example, a macroblock may be encoded in terms of transformed and coded error residual values and also using bits in headers and other fields in the bitstream.

It will be appreciated that the disclosed methods and techniques will benefit video encoder and/or decoder embodiments incorporated within video processing devices such as smartphones, laptops, desktops, and similar devices by allowing the use of the techniques disclosed in the present document.

Some embodiments may be described using the following clause-based format. The first set of clauses show example embodiments of techniques discussed in the previous sections.

A1. A method of video processing. comprising: performing a conversion between a current block of a video and a bitstream representation of the video, wherein the conversion uses a dictionary-based coding mode that maintains or updates one or more dictionaries during an encoding and/or decoding process for the current block, and wherein the conversion is based on the one or more dictionaries.

A2. The method of clause A1, wherein the dictionary-based coding mode is different from an inter prediction mode, an intra prediction mode and an intra block copy (IBC) prediction mode.

A3. The method of clause A1, wherein the dictionary-based coding mode is treated as part of an existing prediction mode used to code the current block.

A4. The method of clause A3, wherein the existing prediction mode is an intra block copy (IBC) prediction mode.

A5. The method of clause A3 or A4, wherein the bitstream representation comprises a first indication of a usage of the existing prediction mode and a second indication of the a usage of the dictionary-based coding mode.

A6. The method of clause A5, wherein the second indication is context coded or bypass coded.

A7. The method of clause A1 or A2, further comprising: making a decision regarding a selective inclusion of an indication of a usage of the dictionary-based coding mode.

A8. The method of clause A7, wherein the indication is MODE DCM.

A9. The method of clause A7 or A8, wherein the indication is included due to a determination that a size of the current block is smaller than or equal to M×N, wherein M and N are positive integers.

A10. The method of clause A7 or A8, wherein the indication is included due to a determination that a width of the current block is less than or equal to M and/or a height of the current block is less than or equal to N, wherein M and N are positive integers.

A11. The method of clause A7 or A8, wherein the indication is included due to a determination that a vertical coordinate and/or a horizontal coordinate of a top-left sample of the current block is not equal to zero.

A12. The method of clause A7 or A8, wherein the indication is included due to a determination that the current block is not contained in a first coding tree unit (CTU).

A13. The method of clause A7 or A8, wherein the indication is included due to a determination that the current block is a luma block that comprises a dual tree coding structure.

A14. The method of clause A1, wherein the one or more dictionaries for the current block are selected based on a size of the current block and/or the information in the bitstream representation.

A15. The method of clause A14, wherein a first dictionary of the one or more dictionaries is used for a block with a size K×L, wherein a second dictionary different from the first dictionary is used for a block with a size M×N, and wherein M≠K and/or N≠L.

A16. The method of any of clauses A1 to A15, wherein each of the one or more dictionaries comprises one or more entries.

A17. The method of clause A16, wherein a maximum number of entries in at least one of the one or more dictionaries is predefined or signaled in the bitstream representation.

A18. The method of clause A16, wherein at least one of the one or more entries comprises multiple samples or pixels.

A19. The method of clause A16, wherein at least one of the one or more entries comprises a block from a reconstructed region.

A20. The method of clause A1, wherein the one or more dictionaries is reset before coding a slice, a tile or a picture comprising the current block, and wherein one or more dictionaries is updated after coding a video unit.

A21. The method of clause A20, wherein the video unit is the current block, or a coding unit (CU), a coding tree unit (CTU) or a CTU row associated with the current block.

A22. The method of clause A20, wherein at least one of the one or more dictionaries is updated based on overlapping blocks with different block sizes contained in the video unit.

A23. The method of clause A1, further comprising: sorting, prior to the conversion, entries in the one or more dictionaries.

A24. The method of clause A23, wherein the sorting is based on a distortion measure between a template of an entry in the one or more dictionaries and a template of the current block.

A25. The method of clause A24, wherein the distortion measure is based on a sum of absolute differences (SAD) computation, a sum of absolute temporal differences (SATD) computation, a sum of squared errors (SSE) computation or a mean-squared error (MSE) computation.

A26. The method of clause A23, wherein the sorting is in a descending order, and wherein only a first K entries are used in the conversion.

A27. The method of clause A1, wherein indices of one or more entries of the one or more dictionaries are implicitly or explicitly signaled in the bitstream representation.

A28. The method of clause A27, wherein the indices are binarized using truncated unary coding, truncated binary coding, fixed length coding or exponential-Golomb coding.

A29. The method of clause A27, wherein the indices are binarized based on a number of the one or more entries in one of the one or more dictionaries.

A30. A method of video processing, comprising: performing a conversion between a current block of a video coded using a palette mode and a bitstream representation of the video, wherein the conversion comprises saving and loading a palette predictor of a palette in the palette mode based on a usage of a local dual tree in the conversion.

A31. The method of clause A30, wherein the palette predictor is saved to a temporary buffer upon a determination that a single tree is switched to a local dual tree.

A32. The method of clause A31, wherein the palette predictor is reset before being used to decode a first block in the local dual tree.

A33. The method of clause A30, wherein the palette predictor is loaded from a temporary buffer upon a determination that a local dual tree is switched to a single tree.

A34. The method of clause A30, wherein a maximally allowed size of the palette is signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block.

A35. The method of clause A30, wherein a maximally allowed size of the palette predictor is signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block.

A36. The method of any of clauses A1 to A35, wherein performing the conversion is further based on at least one of the following: (a) screen contents or natural contents associated with the current block, (b) a message signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block, (c) a position of at least one of the CU, the PU, the TU, the current block or the video coding unit, (d) a height or a width of the current block or a neighboring block, (e) a shape of the current block or the neighboring block, (f) a quantization parameter (QP) of the current block, (g) an indication of a color format for the current block, (h) a coding tree structure applied to the current block, (i) a slice or tile group type or a picture type of a slice, tile or picture comprising the current block, respectively, (j) a color component of a color representation of the video, (k) a temporal layer identification (ID), or (l) a profile, level or tier of a standard associated with the conversion.

A37. The method of any of clauses A1 to A36, wherein the conversion generates the current block from the bitstream representation.

A38. The method of any of clauses A1 to A36, wherein the conversion generates the bitstream representation from the current block.

A39. An apparatus in a video system comprising a processor and a non-transitory memory with instructions thereon, wherein the instructions upon execution by the processor, cause the processor to implement the method in any one of clauses A1 to A38.

A40. A computer program product stored on a non-transitory computer readable media, the computer program product including program code for carrying out the method in any one of clauses A1 to A38.

The second set of clauses show example embodiments of techniques discussed in the previous sections (e.g., Embodiment Examples 1 to 7).

Figure 18A:
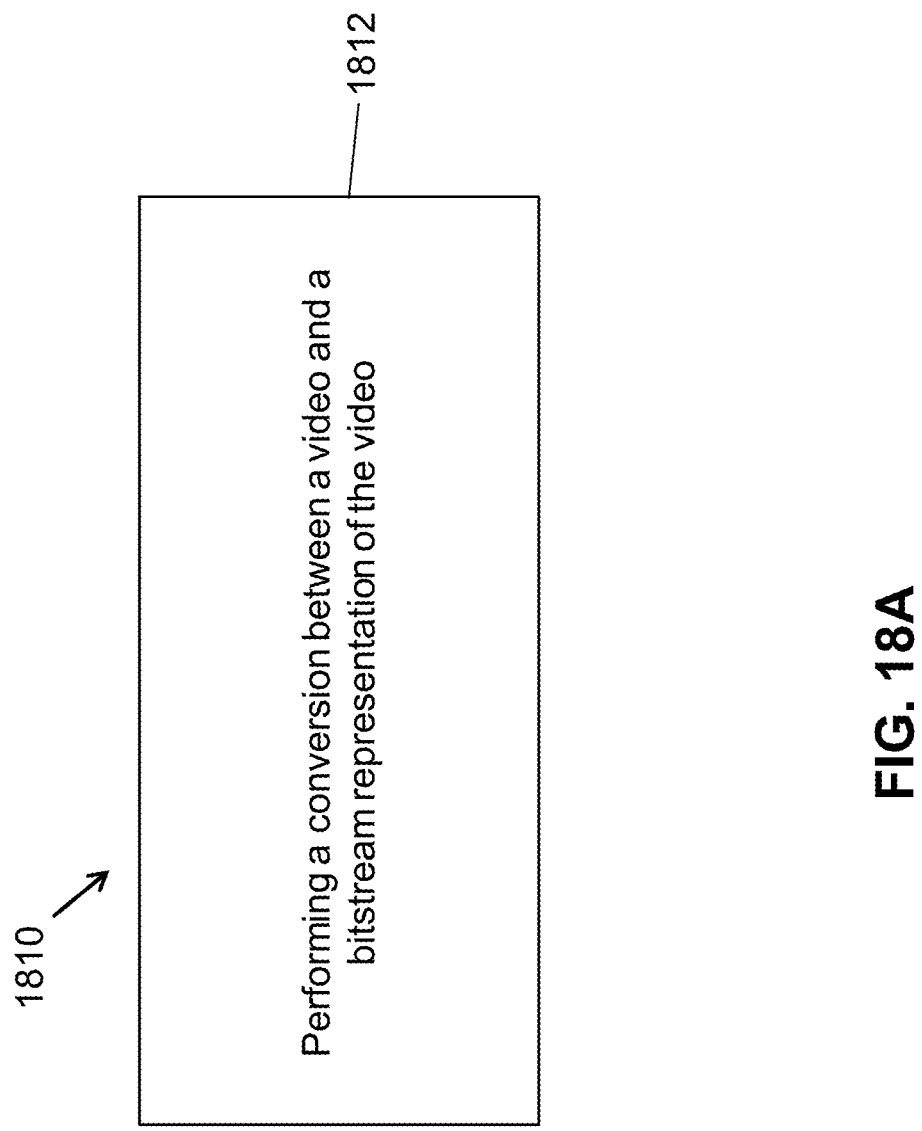
FIGS. 18A to 18C show flowcharts for example methods of video processing based on some implementations of the disclosed technology.

1. A method of video processing (e.g., method 1810 as shown in FIG. 18A), comprising: performing 1812 a conversion between a current block of a video and a bitstream representation of the video, wherein the current block is coded with a dictionary-based coding mode using one or more dictionaries, and wherein the conversion is based on the one or more dictionaries.

2. The method of clause 1, wherein the dictionary-based coding mode is signaled in the bitstream representation differently from an inter prediction mode, an intra prediction mode and an intra block copy (IBC) prediction mode.

3. The method of clause 1, wherein the dictionary-based coding mode is treated as a part of existing prediction modes used for the video.

4. The method of clause 3, the existing prediction modes include an IBC mode.

5. The method of clause 3 or 4, wherein the bitstream representation comprises a first indication of a usage of the existing prediction modes and a second indication of a usage of the dictionary-based coding mode, the second indication signaled based on the first indication.

6. The method of clause 5, wherein the second indication is context coded or bypass coded.

7. The method of clause 1 or 2, wherein the bitstream representation includes an indication of a usage of the dictionary-based coding mode.

8. The method of clause 7, wherein the dictionary-based coding mode is treated as a separate mode from existing prediction modes used for the video.

9. The method of clause 1 or 2, wherein the bitstream representation includes an indication of a usage of the dictionary-based coding mode based on a dimension of the current block.

10. The method of clause 9, wherein the indication is included in the bitstream representation due to the dimension of the current block that is smaller than or equal to M×N, wherein M and N are positive integers.

11. The method of clause 9, wherein the indication is included in the bitstream representation due to a width of the current block that is less than or equal to M and/or a height of the current block that is less than or equal to N, wherein M and N are positive integers.

12. The method of clause 1 or 2, wherein the bitstream representation includes an indication of a usage of the dictionary-based coding mode based on a position of the current block.

13. The method of clause 12, wherein the indication is included in the bitstream representation due to a vertical coordinate and/or a horizontal coordinate of a top-left sample of the current block that is not equal to zero.

14. The method of clause 12, wherein the indication is included in the bitstream representation due to the current block not contained in a first coding tree unit (CTU).

15. The method of clause 1 or 2, wherein the bitstream representation includes an indication of a usage of the dictionary-based coding mode based on previously coded information.

16. The method of clause 15, wherein the indication is included in the bitstream representation due to the current block that is a luma block when a dual tree partition structure is applied.

Figure 18B:
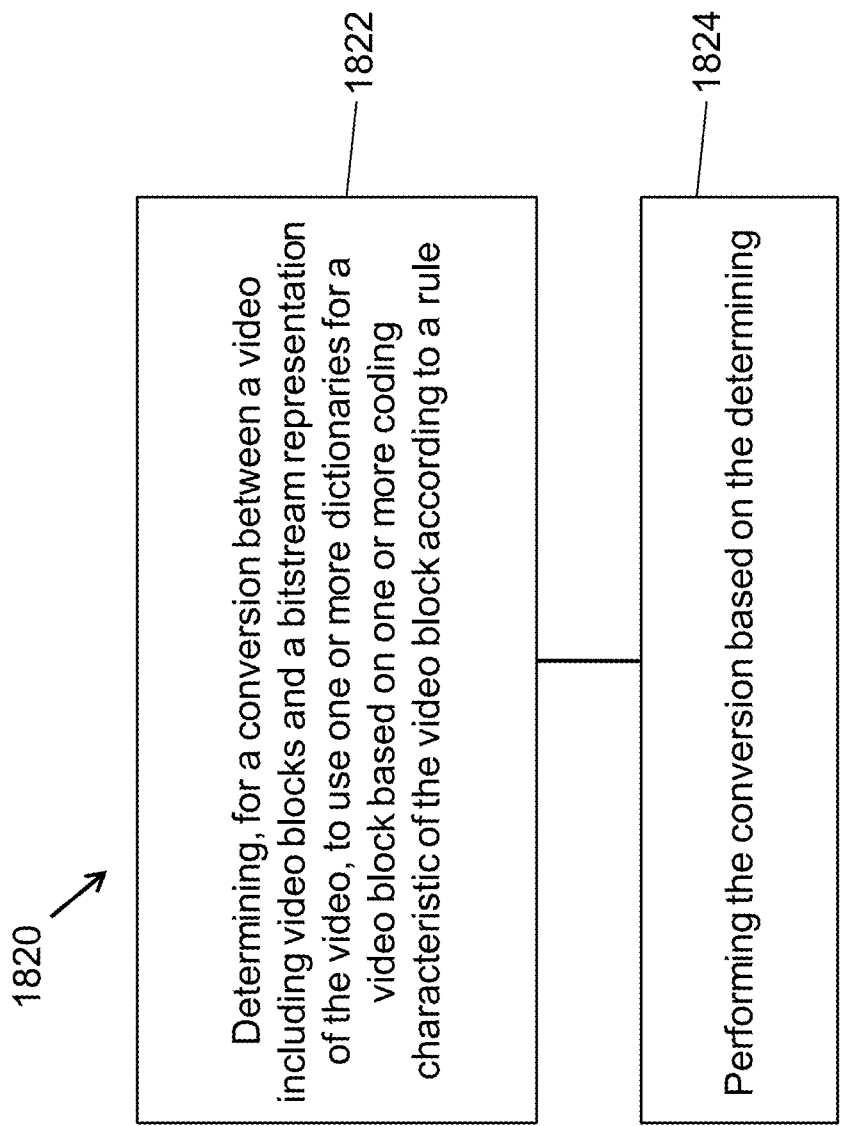

17. A method of video processing (e.g., method 1820 as shown in FIG. 18B), comprising: determining 1822, for a conversion between a video including video blocks and a bitstream representation of the video, to use one or more dictionaries for a video block based on one or more coding characteristic of the video block according to a rule; and performing 1824 the conversion based on the determining, wherein the coding characteristic includes a size of a video block and/or information in the bitstream representation.

18. The method of clause 17, wherein the rule specifies to use multiple dictionaries for the video block and another video block that have same coding characteristics.

19. The method of clause 18, wherein the bitstream representation includes an index of the multiple dictionaries.

20. The method of clause 17, wherein the rule specifies that a first dictionary of the one or more dictionaries is used for the video block with a size K×L, wherein a second dictionary different from the first dictionary is used for another video block with a size M×N, and wherein M≠K and/or N≠L.

21. The method of any of previous clauses, wherein each of the one or more dictionaries comprises one or more entries.

22. The method of clause 21, wherein a maximum number of entries in at least one of the one or more dictionaries is predefined or signaled in the bitstream representation.

23. The method of clause 21, wherein at least one of the one or more entries comprises multiple samples or pixels.

24. The method of clause 21, wherein at least one of the one or more entries comprises a block from a reconstructed region.

Figure 18C:
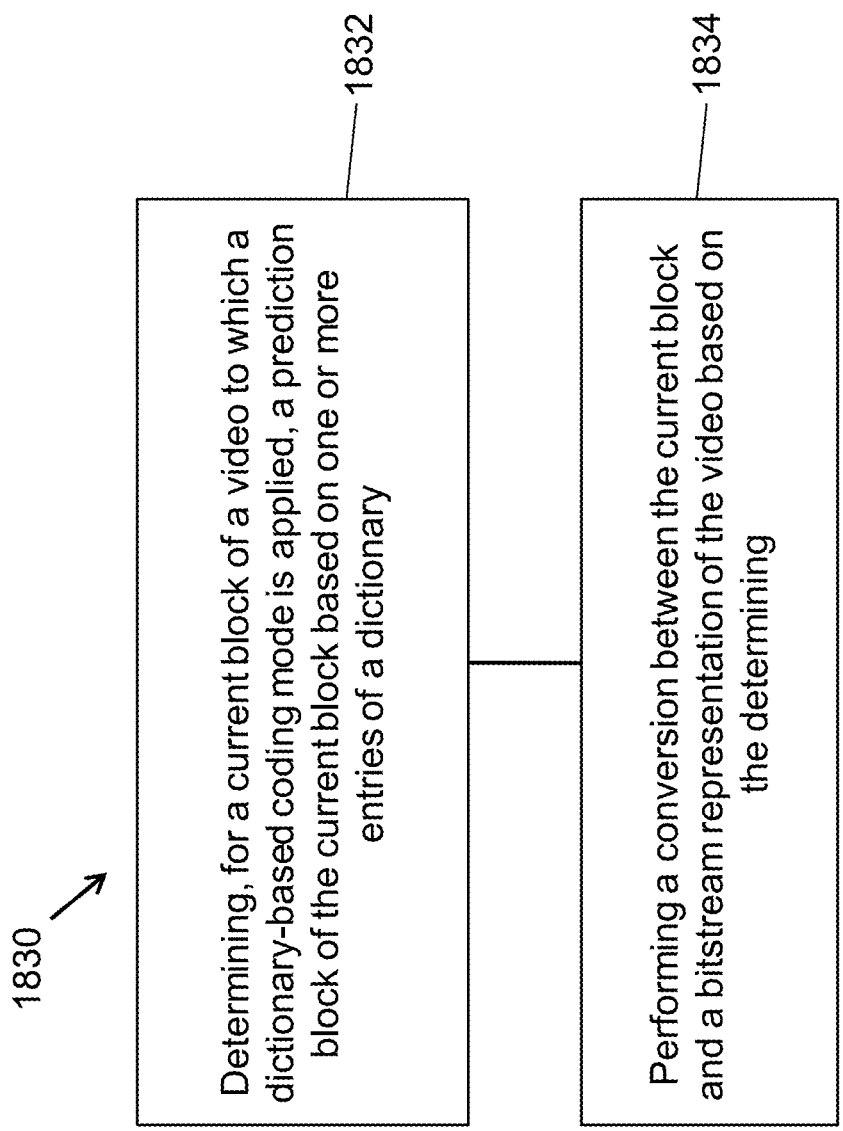

25. A method of video processing (e.g., method 1830 as shown in FIG. 18C), comprising: determining 1832, for a current block of a video to which a dictionary-based coding mode is applied, a prediction block of the current block based on one or more entries of a dictionary; and performing 1834 a conversion between the current block and a bitstream representation of the video based on the determining.

26. The method of clause 25, wherein the prediction block is determined using an entry of the dictionary.

27. The method of clause 26, wherein an index of the entry is included in the bitstream representation.

28. The method of clause 26, wherein an index of the entry is inferred to N, whereby N is an integer.

29. The method of clause 25, wherein how to select an entry is determined by minimizing a certain cost.

30. The method of clause 29, wherein the certain cost corresponds to a rate distortion cost or a rate distortion characteristic between the entry and the current block.

31. The method of clause 29, wherein the certain cost corresponds to a distortion between the entry and the current block.

32. The method of clause 25, wherein the prediction block is determined solely based on multiple entries of the dictionary.

33. The method of clause 25, wherein the prediction block is determined based on multiple entries of the dictionary and a reconstructed area in a current picture including the current block.

34. The method of clause 25, wherein a corresponding residual block between the current block and the prediction block is transformed, quantized and/or entropy coded.

35. A method of video processing, comprising: performing a conversion between a current video unit of a current video region of a video and a bitstream representation of the video, wherein the current video unit is coded in a dictionary-based coding mode using a dictionary, and wherein the dictionary is reset before coding the current video region and updated after coding the current video unit.

36. The method of clause 35, wherein the current video unit is a video block, a coding unit (CU), a coding tree unit (CTU) or a CTU row and the current video region is a slice, a tile, or a picture.

37. The method of clause 35, wherein the dictionary is updated based on overlapping video blocks with different sizes that are contained in the current video region.

38. The method of clause 35, wherein the dictionary is updated based on overlapping video blocks with a size that is equal to M×N, whereby M and N are positive integers.

39. The method of clause 35, wherein a hash function is used to exclude similar or identical video blocks from the dictionary.

40. The method of clause 39, wherein the hash function is a CRC (cyclic redundancy check) function with N bits, whereby N is a positive integer.

41. The method of clause 39, wherein only a latter video block according to a raster order that is of two video blocks having a same hash value is included in the dictionary.

42. The method of clause 39, wherein two video blocks having a same hash value are included in the dictionary.

43. The method of clause 39, wherein the current video unit corresponds to a video block and wherein a hash value of the current video unit is used to update the dictionary.

44. The method of clause 35, wherein each entry in the dictionary is a block list to store blocks with same has values.

45. A method of video processing, comprising: performing a conversion between a current block of a video and a bitstream representation of the video, wherein the current block is coded in a dictionary-based coding mode using a dictionary, wherein a prediction block or a reconstruction block of the current block is derived by sorting entries in the dictionary.

46. The method of clause 45, wherein the sorting is based on a distortion measure between a template of an entry in the dictionary and a template of the current block.

47. The method of clause 46, wherein, for the current block having a size S1×S2, the template is denoted as a M×N region excluding an area corresponding to the size S1×S2, whereby S1, S2, M, and N are positive integers, M>S1 and M>52.

48. The method of clause 46, wherein the distortion measure is based on a sum of absolute differences (SAD) computation, a sum of absolute temporal differences (SATD) computation, a sum of squared errors (SSE) computation or a mean-squared error (MSE) computation.

49. The method of clause 46, wherein the entry includes the current block in a reconstructed region and the template of the current block.

50. The method of clause 45, wherein the sorting is in an ascending or descending order based on a template distortion cost.

51. The method of clause 45, wherein the sorting is in a descending order, and wherein only first K entries are used in the conversion.

52. A method of video processing, comprising: performing a conversion between a current block of a video and a bitstream representation of the video, wherein the current block is coded in a dictionary-based coding mode using a dictionary, and wherein indices of one or more entries of the dictionary are included in the bitstream representation.

53. The method of clause 52, wherein the indices are binarized using a truncated unary coding, a truncated binary coding, a fixed length coding or an exponential-Golomb coding.

54. The method of clause 52, wherein the indices are binarized based on a number of the one or more entries in the dictionary.

55. The method of clause 54, wherein a binarization of the indices has a fixed length with M bits.

56. The method of clause 55, wherein M is equal to floor(log 2(N)), whereby log 2(N) is a function to get a logarithm of N to a base of 2 and floor(N) is a function to get a nearest integer upbound of N.

57. The method of clause 54, wherein the indices are binarized using a truncated binary coding or a truncated unary coding with cMax equal to N.

58. The method of clause 56 or 57, wherein N is a number of all entries or available entries in the dictionary.

59. A method of video processing, performing a conversion between a current block of a video and a bitstream representation of the video, wherein the current block is coded using a palette mode, and wherein the bitstream representation includes syntax elements that are representative of escape samples for each of coefficient groups of the current block.

60. The method of clause 59, wherein the syntax elements are signaled at a coefficient group level.

61. The method of clause 59 or 60, wherein the syntax elements include a flag indicating whether the escape flags of all the coefficient groups are false.

62. The method of clause 59 or 60, wherein an index of syntax elements equal to true is signaled.

63. The method of clause 59 or 60, wherein an index of syntax elements equal to false is signaled.

64. The method of clause 59, wherein another syntax element is indicated at a video block level and the syntax elements are skipped in a case that the another syntax element indicates no escape sample for the current block.

65. The method of clause 59, wherein values of the syntax elements of all of the coefficient groups are concatenated and coded together.

66. The method of clause 65, wherein a syntax element for a coefficient group of the current block is represented using a bit of a variable (E).

67. The method of clause 66, wherein the variable (E) is binarized using a fixed length coding, a truncated unary coding, or exponential-Golomb coding.

68. The method of clause 66, wherein the variable (E) is bypass coded or context coded.

69. The method of any of previous clauses, wherein M and N are equal to 4.

70. The method of any of previous clauses, wherein N corresponds to a predefined constant value for quantization parameters.

71. The method of any of previous clauses, wherein N is included in the bitstream representation of the video.

72. The method of any of previous clauses, wherein N is based on at least one of the following:
  (a) screen contents or natural contents associated with the current block,
  (b) a message signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block,
  (c) a position of at least one of the CU, the PU, the TU, the current block or the video coding unit,
  (d) a height or a width of the current block or a neighboring block,
  (e) a shape of the current block or the neighboring block,
  (f) a quantization parameter (QP) of the current block,
  (g) an indication of a color format for the current block,
  (h) a coding tree structure applied to the current block,
  (i) a slice or tile group type or a picture type of a slice, tile or picture comprising the current block, respectively,
  (j) a color component of a color representation of the video, or
  (k) a temporal layer identification (ID).

73. The method of any of clauses 1 to 72, wherein the conversion includes encoding the video into the bitstream representation.

74. The method of any of clauses 1 to 72, wherein the conversion includes decoding the video from the bitstream representation.

75. A video processing apparatus comprising a processor configured to implement a method recited in any one or more of clauses 1 to 74.

76. A computer readable medium storing program code that, when executed, causes a processor to implement a method recited in any one or more of clauses 1 to 75.

77. A computer readable medium that stores a coded representation or a bitstream representation generated according to any of the above described methods.

The third set of clauses show example embodiments of techniques discussed in the previous sections (e.g., Embodiment Examples 8 to 12).

1. A method of video processing, comprising: performing a conversion between a current block of a video and a bitstream representation of the video, wherein the current video block is coded using a palette mode in which the current block is represented using a palette of representative sample values; wherein the conversion comprises selectively saving and loading a palette predictor of the palette in the palette mode based on a usage of a local dual tree in the conversion.

2. The method of clause 1, wherein the palette predictor is saved to a temporary buffer upon a determination that a single tree is switched to a local dual tree.

3. The method of clause 2, wherein the palette predictor is reset before being used to decode a first block in the local dual tree.

4. The method of clause 1, wherein the palette predictor is loaded from a temporary buffer upon a determination that a local dual tree is switched to a single tree.

5. The method of clause 1, wherein a maximally allowed size of the palette is signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block.

6. The method of clause 1, wherein a maximally allowed size of the palette predictor is signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block.

7. The method of any of clauses 1 to 6, wherein a manner of the performing the conversion is further based on at least one of the following:
  (a) screen contents or natural contents associated with the current block,
  (b) a message signaled in a decoder parameter set (DPS), a sequence parameter set (SPS), a video parameter set (VPS), a picture parameter set (PPS), an adaptation parameter set (APS), a picture header, a slice header, a tile group header, a largest coding unit (LCU), a coding unit (CU), an LCU row, a group of LCUs, a transform unit (TU) or a prediction unit (PU) block or a video coding unit associated with the current block,
  (c) a position of at least one of the CU, the PU, the TU, the current block or the video coding unit,
  (d) a height or a width of the current block or a neighboring block,
  (e) a shape of the current block or the neighboring block,
  (f) a quantization parameter (QP) of the current block,
  (g) an indication of a color format for the current block,
  (h) a coding tree structure applied to the current block,
  (i) a slice or tile group type or a picture type of a slice, tile or picture comprising the current block, respectively,
  (j) a color component of a color representation of the video,
  (k) a temporal layer identification (ID), or
  (l) a profile, level or tier of a standard associated with the conversion.

8. The method of any of clauses 1 to 7, wherein the conversion includes encoding the current block into the bitstream representation.

9. The method of any of clauses 1 to 7, wherein the conversion includes decoding the current block from the bitstream representation.

10. A video processing apparatus comprising a processor configured to implement a method recited in any one or more of clauses 1 to 9.

11. A computer readable medium storing program code that, when executed, causes a processor to implement a method recited in any one or more of clauses 1 to 9.

12. A computer readable medium that stores a coded representation or a bitstream representation generated according to any of the above described methods.

The disclosed and other clauses, solutions, examples, embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

The invention claimed is:

1. A method of processing video data, comprising:
deriving, for a current block being coded with a dictionary-based coding mode using one or more dictionaries, a prediction block or a reconstruction block by sorting entries in a dictionary of the one or more dictionaries; and
performing, based on the one or more dictionaries, a conversion between the current block of a current video region of a video and a bitstream of the video using the prediction block or the reconstruction block,
wherein the sorting is based on a distortion measure between a template of an entry in the dictionary of the one or more dictionaries and a template of the current block, or
wherein the sorting is in an ascending or descending order based on a template distortion cost;
wherein, for the current block having a size S1×S2, the template is denoted as a M×N region excluding an area corresponding to the size S1×S2, and S1, S2, M, and N are positive integers, M>S1 and M>S2, and
wherein the entry includes the current block in a reconstructed region and the template of the current block.

2. The method of claim 1, wherein the prediction block of the current block is based on one or more entries of the dictionary of the one or more dictionaries.

3. The method of claim 2, wherein the prediction block is determined using an entry of the dictionary of the one or more dictionaries, and
wherein an index of the entry is included in the bitstream, or
the index of the entry is inferred to N, and N is an integer.

4. The method of claim 2, wherein how to select an entry of the dictionary of the one or more dictionaries is determined by minimizing a certain cost,
wherein the certain cost corresponds to a rate distortion cost or a rate distortion characteristic between the entry and the current block, or
the certain cost corresponds to a distortion between the entry and the current block.

5. The method of claim 2, wherein the prediction block is determined solely based on multiple entries of the dictionary of the one or more dictionaries, or
wherein the prediction block is determined based on multiple entries of the dictionary of the one or more dictionaries and a reconstructed area in a current picture including the current block.

6. The method of claim 2, wherein a corresponding residual block between the current block and the prediction block is transformed, quantized and/or entropy coded.

7. The method of claim 1, wherein the dictionary of the one or more dictionaries is reset before coding the current video region and updated after coding the current block.

8. The method of claim 7, wherein the dictionary of the one or more dictionaries is updated based on overlapping video blocks with different sizes that are contained in the current video region, or
wherein the dictionary of the one or more dictionaries is updated based on overlapping video blocks with a size that is equal to M×N, and M and N are positive integers.

9. The method of claim 7, wherein a hash function is used to exclude similar or identical video blocks from the dictionary of the one or more dictionaries.

10. The method of claim 9, wherein the hash function is a cyclic redundancy check function with N bits, and N is a positive integer;
wherein only a latter video block according to a raster order that is of two video blocks having a same hash value is included in the dictionary of the one or more dictionaries, or two video blocks having a same hash value are included in the dictionary of the one or more dictionaries;
wherein each entry in the dictionary of the one or more dictionaries is a block list to store blocks with same hash values.

11. The method of claim 1,
wherein the distortion measure is based on a sum of absolute differences (SAD) computation, a sum of absolute temporal differences (SATD) computation, a sum of squared errors (SSE) computation or a mean-squared error (MSE) computation.

12. The method of claim 1, wherein indices of one or more entries of the dictionary of the one or more dictionaries are included in the bitstream, and
wherein the indices are binarized using a truncated unary coding, a truncated binary coding, a fixed length coding or an exponential-Golomb coding.

13. The method of claim 12, wherein the indices are binarized based on a number of the one or more entries in the dictionary of the one or more dictionaries, and
wherein a binarization of the indices has a fixed length with M bits, wherein M is equal to floor (log 2(N)), wherein log 2(N) is a function to get a logarithm of N to a base of 2 and floor (N) is a function to get a nearest integer upbound of N, or
the indices are binarized using a truncated binary coding or a truncated unary coding with cMax equal to N,
wherein N is a number of all entries or available entries in the dictionary of the one or more dictionaries.

14. The method of claim 1, wherein how to select the dictionary of the one or more dictionaries for the current block is based on coding characteristic of the current block, and the coding characteristic includes a size of the current block and/or information in the bitstream.

15. The method of claim 1, wherein the conversion includes encoding the current block into the bitstream.

16. The method of claim 1, wherein the conversion includes decoding the current block from the bitstream.

17. An apparatus for processing video data comprising a processor and a non-transitory memory with instructions thereon, wherein the instructions upon execution by the processor, cause the processor to:
derive, for a current block being coded with a dictionary-based coding mode using one or more dictionaries, a prediction block or a reconstruction block by sorting entries in a dictionary of the one or more dictionaries; and
perform, based on the one or more dictionaries, a conversion between the current block of a current video region of a video and a bitstream of the video using the prediction block or the reconstruction block,
wherein the sorting is based on a distortion measure between a template of an entry in the dictionary of the one or more dictionaries and a template of the current block, or
wherein the sorting is in an ascending or descending order based on a template distortion cost,
wherein, for the current block having a size S1×S2, the template is denoted as a M×N region excluding an area corresponding to the size S1×S2, and S1, S2, M, and N are positive integers, M>S1 and M>S2, and
wherein the entry includes the current block in a reconstructed region and the template of the current block.

18. A non-transitory computer-readable recording medium storing a bitstream of a video which is generated by a method performed by a video processing apparatus, wherein the method comprises:
deriving, for a current block being coded with a dictionary-based coding mode using one or more dictionaries, a prediction block or a reconstruction block by sorting entries in a dictionary of the one or more dictionaries; and
generating, based on the one or more dictionaries, for the current block of a current video region of the video, the bitstream of the video using the prediction block or the reconstruction block,
wherein the sorting is based on a distortion measure between a template of an entry in the dictionary of the one or more dictionaries and a template of the current block, or
wherein the sorting is in an ascending or descending order based on a template distortion cost,
wherein, for the current block having a size S1×S2, the template is denoted as a M×N region excluding an area corresponding to the size S1×S2, and S1, S2, M, and N are positive integers, M>S1 and M>S2, and
wherein the entry includes the current block in a reconstructed region and the template of the current block.

19. The apparatus of claim 17, wherein the prediction block of the current block is based on one or more entries of the dictionary of the one or more dictionaries.

20. The apparatus of claim 19, wherein the prediction block is determined using an entry of the dictionary of the one or more dictionaries, and wherein an index of the entry is included in the bitstream, or the index of the entry is inferred to N, and N is an integer.

* * * * *